US011919241B1

(12) United States Patent
Somarakis et al.

(10) Patent No.: US 11,919,241 B1
(45) Date of Patent: Mar. 5, 2024

(54) OPTIMIZED NOZZLE DESIGN FOR DROP-ON-DEMAND PRINTERS AND METHODS THEREOF

(71) Applicant: XEROX CORPORATION, Norwalk, CT (US)

(72) Inventors: Christoforos Somarakis, Gilroy, CA (US); Svyatoslav Korneev, San Jose, CA (US); Saigopal Nelaturi, Mountain View, CA (US); Adrian Lew, Stanford, CA (US)

(73) Assignee: XEROX CORPORATION, Norwalk, CT (US)

( * ) Notice: Subject to any disclaimer, the term of this patent is extended or adjusted under 35 U.S.C. 154(b) by 334 days.

(21) Appl. No.: 17/185,826

(22) Filed: Feb. 25, 2021

(51) Int. Cl.
*B29C 64/386* (2017.01)
*B22F 10/80* (2021.01)
(Continued)

(52) U.S. Cl.
CPC ............ *B29C 64/386* (2017.08); *B22F 10/80* (2021.01); *B33Y 50/00* (2014.12); *G06F 30/10* (2020.01);
(Continued)

(58) Field of Classification Search
CPC ....... B29C 64/386; B33Y 50/00; G06F 30/20; G06F 30/10; B22F 10/80
(Continued)

(56) References Cited

U.S. PATENT DOCUMENTS

| 3,041,825 A | 7/1962 | Alford et al. | |
| 4,675,493 A * | 6/1987 | Gartland | H05H 1/3405 |
| | | | 219/136 |

(Continued)

FOREIGN PATENT DOCUMENTS

| CA | 2519273 C | 10/2004 |
| JP | H0825620 A | 1/1996 |

OTHER PUBLICATIONS

Hoath et al. ("Drop Speeds from Drop-on-Demand Ink-Jet Print Heads" Society for Imaging Science and Technology 2013. pp 1-11) (Year: 2013).*
Saedan et al. (Development of a multi-nozzle drop-on-demand system for multi-material dispensing, Journal of Materials Processing Technology 209 (2009) 4444-4448) (Year: 2009).*
(Continued)

*Primary Examiner* — Iftekhar A Khan
(74) *Attorney, Agent, or Firm* — MH2 Technology Law Group LLP

(57) ABSTRACT

A method is disclosed for designing a nozzle for jetting printing material in a printing system including selecting a surface tension and viscosity of a printing material at a jetting temperature, selecting a drop volume of the printing material, and constructing a constricted axisymmetric dissipative section of the nozzle, which may include defining a length of the constricted axisymmetric dissipative section and defining a cross-sectional area of the constricted axisymmetric dissipative section. Other methods are disclosed involving receiving an input for a drop volume of the printing material, constructing a simulation of a constricted dissipative section of the nozzle by defining a length of the constricted dissipative section with respect to an orifice length and defining a cross-sectional area of the constricted dissipative section, and outputting the simulation of the constricted dissipative section to a display device and displaying on the display device an image representing the constricted dissipative section.

30 Claims, 20 Drawing Sheets

(51) Int. Cl.
  *B22F 12/53*   (2021.01)
  *B29C 64/209*  (2017.01)
  *B33Y 30/00*   (2015.01)
  *B33Y 50/00*   (2015.01)
  *G06F 30/10*   (2020.01)
  *G06F 30/20*   (2020.01)

(52) U.S. Cl.
  CPC .............. *G06F 30/20* (2020.01); *B22F 12/53* (2021.01); *B29C 64/209* (2017.08); *B33Y 30/00* (2014.12)

(58) Field of Classification Search
  USPC ............................................................. 703/1
  See application file for complete search history.

(56) References Cited

U.S. PATENT DOCUMENTS

| | | | | |
|---|---|---|---|---|
| 4,882,595 | A * | 11/1989 | Trueba | B41J 2/1404 347/85 |
| 5,170,942 | A * | 12/1992 | Spink | B05B 7/08 239/431 |
| 5,573,682 | A * | 11/1996 | Beason, Jr. | H05H 1/34 427/446 |
| 6,474,783 | B1 * | 11/2002 | Pilossof | B41J 2/14008 347/51 |
| 8,622,715 | B1 * | 1/2014 | Lott | F04F 5/46 417/198 |
| 11,524,463 | B2 * | 12/2022 | Korneev | B29C 64/393 |
| 11,525,463 | B2 * | 12/2022 | Sun | F04D 17/167 |
| 11,571,740 | B2 * | 2/2023 | Korneev | B33Y 50/00 |
| 2003/0170903 | A1 * | 9/2003 | Johnson | G01N 35/1065 436/100 |
| 2004/0217186 | A1 * | 11/2004 | Sachs | B33Y 10/00 239/11 |
| 2006/0203036 | A1 * | 9/2006 | Sexton | B41J 2/1631 205/75 |
| 2007/0091150 | A1 * | 4/2007 | Kodama | B41J 2/17566 347/68 |
| 2007/0176022 | A1 * | 8/2007 | Haiun | B05B 1/34 239/69 |
| 2010/0053270 | A1 * | 3/2010 | Xu | B41J 2/1433 347/47 |
| 2010/0328402 | A1 * | 12/2010 | Xie | B41J 2/175 347/85 |
| 2011/0187798 | A1 * | 8/2011 | Rogers | B41J 2/06 347/55 |
| 2012/0105528 | A1 * | 5/2012 | Alleyne | B41J 2/06 347/14 |
| 2013/0273239 | A1 * | 10/2013 | Harikrishna Mohan | B05B 1/3402 427/255.6 |
| 2015/0147421 | A1 * | 5/2015 | Te | B29C 64/40 118/302 |
| 2017/0087632 | A1 * | 3/2017 | Mark | B22D 27/003 |
| 2019/0061380 | A1 * | 2/2019 | Luan | B41J 11/0021 |
| 2019/0176391 | A1 * | 6/2019 | Rudolph | B29C 64/209 |
| 2020/0157718 | A1 * | 5/2020 | D'Herin Bytner | D04H 1/4218 |
| 2020/0164575 | A1 * | 5/2020 | Yuwaki | B29C 64/209 |
| 2020/0215750 | A1 * | 7/2020 | Long | B29C 64/209 |
| 2020/0290350 | A1 * | 9/2020 | Budraa | B41J 2/145 |
| 2020/0376507 | A1 * | 12/2020 | Ozdemir | B05B 7/1626 |
| 2021/0138794 | A1 * | 5/2021 | Chen | B41J 2/1433 |
| 2022/0168817 | A1 * | 6/2022 | Sambhy | B33Y 10/00 |
| 2022/0266512 | A1 * | 8/2022 | Somarakis | B22D 23/003 |
| 2022/0266513 | A1 * | 8/2022 | Somarakis | B33Y 30/00 |

OTHER PUBLICATIONS

Simonelli et al. (Towards digital metal additive manufacturing via high-temperature drop-on-demand jetting, Additive Manufacturing 30 (2019) pp. 1-9) (Year: 2019).*
Stachewicz et al. ("Relaxation Times in Single Event Electrospraying Controlled by Nozzle Front Surface Modification" Langmuir 2009, 25, 2540-2549) (Year: 2009).*
Castrejón-Pita, A.A., et al., "Breakup of Liquid Filaments," Physical Review Letters, vol. 108, No. 7, 2012 (Week ending Feb. 17, 2012), pp. 074506-1-074506-5.
Tamayol, A., et al., "Laminar Flow in Microchannels With Noncircular Cross Section," Journal of Fluids Engineering, vol. 132, Nov. 2010, pp. 111201-1-111201-9.
Van Rijn, C.J.M., et al., "Droplet Formation by Confined Liquid Threads inside Microchannels," Langmuir, vol. 33, 2017 (Published Sep. 4, 2017), pp. 10035-10040.
Yuan, R., et al., "Microfluidics in structured multimaterial fibers," PNAS, vol. 115, No. 46, 2018 (Published online Oct. 29, 2018), pp. E10830-E10838.
Kungurtsev, P.V., "Adjoint-based optimization for inkjet printing," Ph.D. Dissertation, Department of Engineering, University of Cambridge, St. Edmund's College, Dec. 2020, 184 pages.
Kungurtsev, P.V., et al., "Adjoint-based shape optimization of the microchannels in an inkjet printhead," J. Fluid Mech., vol. 871, 2019 (First Published Online May 17, 2019), pp. 113-138.
Bierbrauer, F., et al., "Drop Pinch-Off for Discrete Flows from a Capillary," ESAIM: Proceedings, vol. 40, Jul. 2013, pp. 16-33.

* cited by examiner

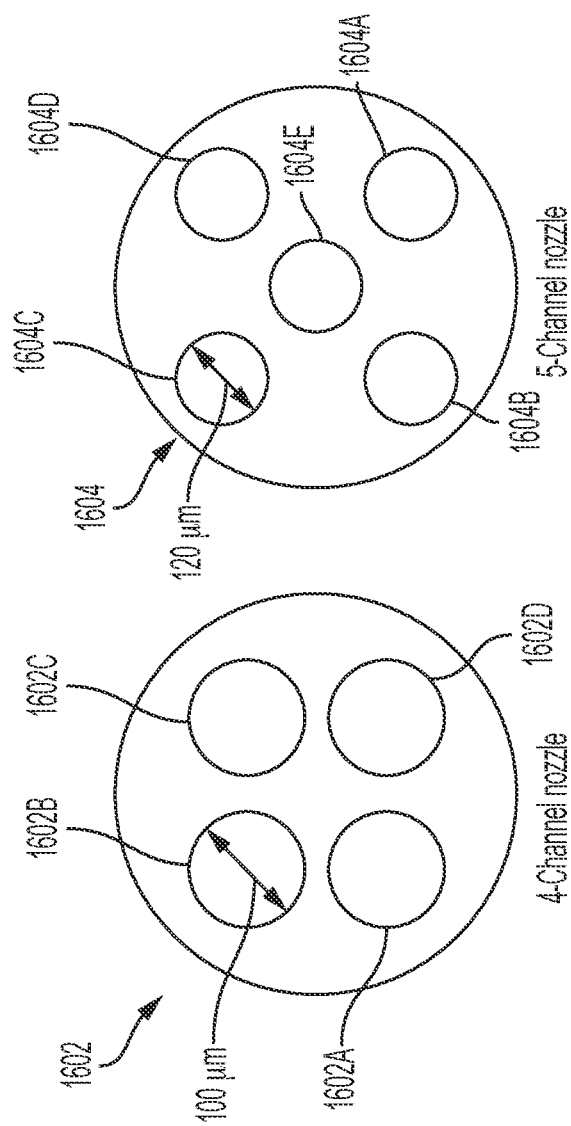

OPTIMIZED NOZZLE DESIGN FOR DROP-ON-DEMAND PRINTERS AND METHODS THEREOF

TECHNICAL FIELD

The presently disclosed embodiments or implementations are directed to methods for the design of energy dissipative nozzles for drop-on-demand printing systems.

BACKGROUND

Drop-On-Demand (DOD) printing systems, such as ink-jet or liquid metal-jet, attain significant advantages over alternative technologies, two of which are the lack of additional post-printing processing steps and relative affordability. Unfortunately, DOD basic performance metrics (e.g. printing speed, accuracy) are on average lower than other technologies and sensitive to product geometry. Products with complex geometries manufactured with liquid metal DOD technologies may require hundreds of thousands or millions of droplets and may take appreciably longer times to be built. Printed parts may also deviate from as-planned computer aided designs (CAD), due to accumulating error from the nominal geometry per deposited droplet. Furthermore, speed and accuracy are correlated with a fundamental trade-off: Printing speed comes at the cost of accuracy. Therefore, droplet speed, shape and volume play a significant role in printing quality metrics.

In a DOD ejection system, the focus of this fundamental tradeoff is within the ejector nozzle, a device designed to control fluid flow and eject droplets with consistent characteristics such as shape, volume, and speed to meet a required throughput characterized by mass ejected per unit of time. The application for which the nozzle is designed drives the desired droplet characteristics; for example in 3D printing systems large/bulky droplets may be undesirable because of the agility required to print complex geometric objects, whereas in liquid dosage applications larger droplets may be desirable. Throughput requirements are set to make the droplet ejection system economically attractive for the application.

Both theoretical and experimental evidence suggests that printing irregularities may arise due to unpredictable speed, shape, and volume of the droplets generated by the nozzle, in lieu of the constant nominal values expected by design. These irregularities have been traced to both the dynamics of the liquid in the tank feeding the nozzle and the time it takes for the liquid inside the nozzle to become quiescent, since both alter the initial condition and pressure signal under which each new droplet is generated.

Requirements on the throughput and droplet characteristics in turn imply a requirement on the frequency at which the nozzle must eject consistent droplets. Experimental evidence indicates the firing frequency for stable drop-to-drop behavior is affected by the time it takes for the meniscus (the boundary between fluid and atmosphere at the nozzle orifice) to settle after droplet ejection, i.e. a drop should ideally be ejected when the meniscus is quiescent. Droplets fired after the meniscus is quiescent show consistent characteristics, whereas ejecting droplets at frequencies faster than the reciprocal of the settling time can result in significant drop-to-drop variation. Thus the nozzle must be designed such that the settling time of the meniscus after droplet ejection, also referred to as the relaxation time, is small enough to permit a desired firing frequency.

A nozzle having a design capable of simultaneously controlling the relaxation time and droplet characteristics is desirable, particularly one wherein the problem of controlling the relaxation time may be decoupled from the problem of shaping the droplet. What is needed are nozzle designs concurrently addressing the foregoing criteria while allowing for adaptation of printing media and application and methods for designing the same.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

A method is disclosed for designing a nozzle for jetting printing material in a printing system including selecting a surface tension and viscosity of a printing material at a jetting temperature, selecting a drop volume of the printing material, and constructing a constricted axisymmetric dissipative section of the nozzle, which may further include defining a length of the constricted axisymmetric dissipative section with respect to an orifice length, and defining a cross-sectional area of the constricted axisymmetric dissipative section.

Certain embodiments of the disclosed method for designing a nozzle for jetting printing material in a printing system may also include selecting an exit orifice size and shape of a shaping section of the nozzle. The method may include selecting a length of a transition zone between the constricted axisymmetric dissipative section and a shaping section. The method may include selecting an exit orifice size and a shape of a shaping section of the nozzle. The method may include selecting a length of a transition zone between the constricted axisymmetric dissipative section and a shaping section. The method may include selecting a pressure pulse waveform; and applying the pressure pulse waveform to an upper boundary of the nozzle. The pressure pulse waveform further may include: a magnitude of a positive generation portion of the pressure pulse waveform, Mp; and a duration of a positive generation portion of the pressure pulse waveform, tp. The method may include selecting a drop speed for jetting a printing material. The cross-sectional area of the constricted axisymmetric dissipative section may be further defined as a function of a specified relaxation time of a printing material. The method may include ejecting a droplet from the nozzle.

Another method is disclosed for designing a nozzle for jetting printing material in a printing system including selecting a surface tension and viscosity of a printing material at a jetting temperature and selecting a drop volume of the printing material. The method may also include constructing a constricted dissipative section of the nozzle having at least three channels and may include defining a length of the constricted dissipative section with respect to an orifice length, and defining a cumulative cross-sectional area of the at least three channels of the constricted dissipative section of the nozzle.

Another disclosed method for designing a nozzle for jetting printing material in a printing system includes selecting a surface tension and viscosity of a printing material at a jetting temperature and selecting a drop volume of the printing material. The method also includes constructing a constricted dissipative section of the nozzle, may comprise defining a length of the constricted dissipative section with respect to an orifice length, and defining a permeability of the constricted dissipative section of the nozzle may include a porous media.

Another method is disclosed for designing a nozzle for jetting printing material in a printing system which may also include constructing a constricted dissipative section of the nozzle, comprising defining a length of the constricted dissipative section with respect to an orifice length, and defining a cross-sectional area of the constricted dissipative section of the nozzle having at least two intersecting channels where the at least two intersecting channels may include at least two walls that are parallel to one another.

A method involving a computer readable medium may include instructions in which the computer readable medium also includes receiving an input for a surface tension and viscosity of a printing material at a jetting temperature. The method also includes receiving an input for a drop volume of the printing material. The method includes constructing a simulation of a constricted dissipative section of the nozzle by defining a length of the constricted dissipative section with respect to an orifice length and defining a cross-sectional area of the constricted dissipative section. The method also includes outputting the simulation of the constricted dissipative section to a display device and displaying on the display device an image representing the constricted dissipative section.

BRIEF DESCRIPTION OF THE DRAWINGS

The accompanying drawings, which are incorporated in and constitute a part of this specification, illustrate embodiments of the present teachings. These and/or other aspects and advantages in the embodiments of the disclosure will become apparent and more readily appreciated from the following description of the various embodiments, taken in conjunction with the accompanying drawings of which:

FIGS. 16A and 16B illustrate top views of a dissipative section in a multichannel nozzle having four channels and five channels, respectively.

DETAILED DESCRIPTION

Figure 1:
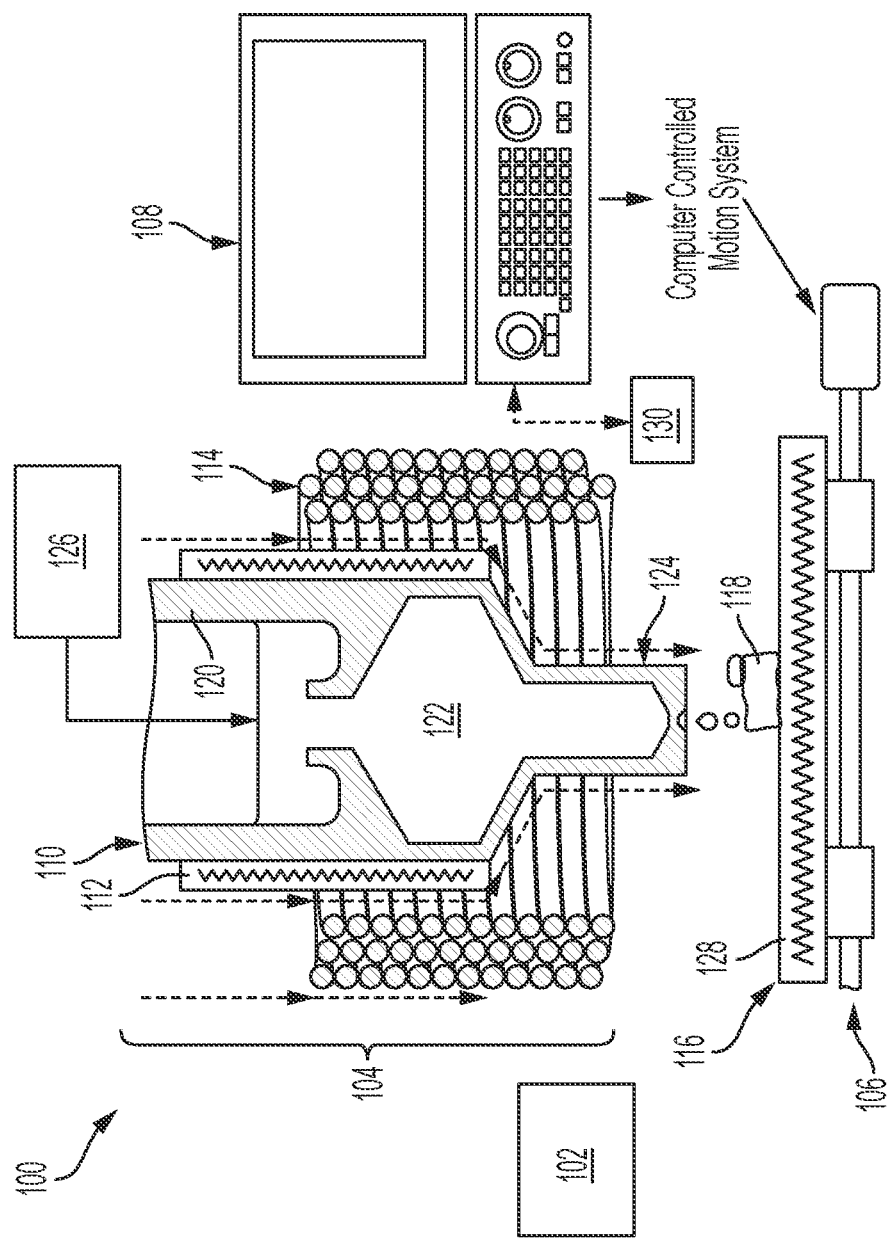
FIG. 1 illustrates a schematic cross-sectional view of an exemplary additive manufacturing layering device or 3D printer incorporating a nozzle design, according to one or more embodiments disclosed.

The following description of various typical aspect(s) is merely exemplary in nature and is in no way intended to limit the disclosure, its application, or uses.

As used throughout, ranges are used as shorthand for describing each and every value that is within the range. Any value within the range may be selected as the terminus of the range. In addition, all references cited herein are hereby incorporated by reference in their entireties. In the event of a conflict in a definition in the present disclosure and that of a cited reference, the present disclosure controls.

Additionally, all numerical values are "about" or "approximately" the indicated value, and take into account experimental error and variations that would be expected by a person having ordinary skill in the art. It should be appreciated that all numerical values and ranges disclosed herein are approximate values and ranges, whether "about" is used in conjunction therewith. It should also be appreciated that the term "about," as used herein, in conjunction with a numeral refers to a value that may be ±0.01% (inclusive), ±0.1% (inclusive), ±0.5% (inclusive), ±1% (inclusive) of that numeral, ±2% (inclusive) of that numeral, ±3% (inclusive) of that numeral, ±5% (inclusive) of that numeral, ±10% (inclusive) of that numeral, or ±15% (inclusive) of that numeral. It should further be appreciated that when a numerical range is disclosed herein, any numerical value falling within the range is also specifically disclosed.

As used herein, the term "or" is an inclusive operator, and is equivalent to the term "and/or," unless the context clearly dictates otherwise. The term "based on" is not exclusive and allows for being based on additional factors not described, unless the context clearly dictates otherwise. In the specification, the recitation of "at least one of A, B, and C," includes embodiments containing A, B, or C, multiple examples of A, B, or C, or combinations of A/B, A/C, B/C, A/B/B/B/B/C, A/B/C, etc. In addition, throughout the specification, the meaning of "a," "an," and "the" include plural references. The meaning of "in" includes "in" and "on."

Reference will now be made in detail to exemplary embodiments of the present teachings, examples of which are illustrated in the accompanying drawings. Wherever possible, the same reference numbers will be used throughout the drawings to refer to the same, similar, or like parts.

The present disclosure is directed to additive manufacturing devices or 3D printers and methods for the same. Particularly, the present disclosure is directed to targeted heating systems for the 3D printers and methods for the same. Forming structures with molten metal droplets is a complex thermo-fluidic process that involves re-melting, coalescence, cooling, and solidification. Voids and cold lap (lack of fusion) are caused by poor re-melting and insufficient metallurgical bonding under inappropriate temperatures at the interface formed between the molten metal droplets and previously deposited material or substrates (e.g., droplets). The interfacial temperature is determined primarily by the droplet temperature and the surface temperature of the previously deposited material or substrate. Obtaining and retaining accurate part shape and z-height are also negatively impacted by the same factors. An interfacial temperature that is too low results in the formation of voids and cold laps from insufficient re-melting and coalescence. For an interfacial temperature that is too high, the new droplets flow away from the surface of previously deposited material before solidification, which leads to the malformation of part shape and z-height error. The interfacial temperature can be affected by the initial droplet temperature, the build part surface temperature, the build plate temperature, drop frequency, and part z-height. It can be controlled at some level through process parameter optimization, but the thermal processes involved may be too slow to keep up with the changes and dynamics that occur during part printing that can result in unacceptable interfacial temperatures. As further described herein, the targeted heating systems may be capable of or configured to modify interfacial temperatures and/or temperature gradients of a substrate and/or an area proximal the substrate to control grain size, growth, and/or structure of the metal forming an article prepared by the 3D printer to address the aforementioned issues. For example, the targeted heating system may be capable of or configured to modify interfacial temperatures and/or temperature gradients of a melt pool to control grain size, growth, and/or structure of the metal forming the article, thereby improving build strength, adhesion, porosity, and/or surface finish, and preventing cracks and fractures in the article.

FIG. 1 illustrates a schematic cross-sectional view of an exemplary drop-on-demand (DOD) printing device or 3D printer 100 incorporating a targeted heating system 102, according to one or more embodiments. The 3D printer 100 may be a liquid metal jet printing system, such as a magnetohydrodynamic (MHD) printer. It should be appreciated, however, that any drop-on-demand (DOD) printing device may utilize the components and methods disclosed herein. The 3D printer 100 may include a printhead 104, a stage 106, a computing system 108, the targeted heating system 102, or any combination thereof. The computing system 108 may be operably and/or communicably coupled with any one or more of the components of the 3D printer 100. The computing system 108 may be capable of or configured to operate, modulate, instruct, receive data from, or the like from any one or more of the components of the 3D printer 100. The printhead 104 may include a body 110, which may also be referred to herein as a pump chamber, one or more heating elements (one is shown 112), one or more metallic coils 114, or any combination thereof, operably coupled with one another. As illustrated in FIG. 1, the heating elements 112 may be at least partially disposed about the body 110, and the metallic coils 114 may be at least partially disposed about the body 110 and/or the heating elements 112. As used herein, a substrate 116 may refer to a surface of the stage 106, a previously deposited printing material or metal (e.g., metal droplets), an article 118 fabricated from the 3D printer 100 or a portion thereof, a platen 128, such as a heated platen or build plate disposed on the stage 106, and/or respective surfaces thereof. As illustrated in FIG. 1, the substrate 116 may be disposed on or above the stage 106 and below the body 110. The body 110 may have an inner surface 120 defining an inner volume 122 thereof. The body 110 may define a nozzle 124 disposed at a first end portion of the body 110. The body 110 of the printhead 104 may also define more than one nozzle 124 which may operate in conjunction with one another, or alternatively be independently operable from one another.

In an exemplary operation of the 3D printer 100 with continued reference to FIG. 1, a build material (e.g., metal) from a source 126 may be directed to the inner volume 122 of the body 110. The heating elements 112 may at least partially melt the build material contained in the inner volume 122 of the body 110. For example, the build material may be a solid, such as a solid metal, and the heating elements 112 may heat the body 110 and thereby heat the build material from a solid to a liquid (e.g., molten metal). The metallic coils 114 may be coupled with a power source (not shown) capable of or configured to facilitate the deposition of the build material on the substrate 116. For example, the metallic coils 114 and the power source coupled therewith may be capable of or configured to generate a magnetic field, which may generate an electromotive force within the body 110, thereby generating an induced electrical current in the molten metal disposed in the body 110. The magnetic field and the induced electrical current in the molten metal may create a radially inward force on the liquid metal, known as a Lorentz force, which creates a pressure at the nozzle 124. The pressure at the nozzle 124 may expel the molten metal out of the nozzle 124 toward the substrate 116 and/or the stage 106 in the form of one or more drops to thereby form at least a portion of the article 118.

In at least one embodiment, the build material may be or include one or more metals and/or alloys thereof. Illustrative build materials may be or include, but are not limited to, aluminum, aluminum alloys, brass, bronze, chromium, cobalt-chrome alloys, copper, copper alloys, iron alloys (Invar), nickel, nickel alloys (Inconel), nickel-titanium alloys (Nitinol), stainless steel, tin, titanium, titanium alloys, gold, silver, molybdenum, tungsten, or the like, or alloys thereof, or any combination thereof. It should be appreciated that the droplet and substrate temperatures will be different for different metals.

In another embodiment, the build material may be or include one or more polymeric materials or polymers, or composites thereof. The polymers may be or include functional polymers. Illustrative functional polymers may include, but are not limited to, heat resistant polymers, conductive polymers, piezoelectric polymers, photosensitive polymers, or any combination thereof. The polymers may also be or include, but are not limited to, polyolefin-based polymers, acryl-based polymers, polyurethane-based polymers, ether-based polymers, polyester-based polymers, polyamide-based polymers, formaldehyde-based polymers, silicon-based polymers, or any combination thereof. For example, the polymers may include, but are not limited to, poly(ether ether ketone) (PEEK), TORLON®, polyamide-imides, polyethylene (PE), polyvinyl fluoride (PVF), poly-vinyl chloride (PVC), polyvinylidene fluoride (PVDF), polyvinylidene chloride (PVDC), polychlorotrifluoroethylene (PCTFE), polytetrafluoroethylene (PTFE), polypropylene (PP), poly(1-butene), poly(4-methylpentene), polystyrene, polyvinyl pyridine, polybutadiene, polyisoprene, polychloroprene, styrene-acrylonitrile copolymer, acrylonitrile-butadiene-styrene terpolymer, ethylene-methacrylic acid copolymer, styrene-butadiene rubber, tetrafluoroethylene copolymer, polyacrylate, polymethacrylate, polyacrylamide, polyvinyl acetate, polyvinyl alcohol, polyvinyl butyral, polyvinyl ether, polyvinylpyrrolidone, polyvinylcarbazole, polyurethane, polyacetal, polyethylene glycol, polypropylene glycol, epoxy resins, polyphenylene oxide, polyethylene terephthalate, polybutylene terephthalate, polydihydroxymethylcyclohexyl terephthalate, cellulose esters, polycarbonate, polyamide, polyimide, any copolymers thereof, or any combination thereof. In at least one embodiment, the polymer may be or include an elastomer, synthetic rubber, or any combination thereof. Illustrative elastomeric materials and synthetic rubbers may include, but are not limited to, VITON®, nitrile, polybutadiene, acrylonitrile, polyisoprene, neoprene, butyl rubber, chloroprene, polysiloxane, styrene-butadiene rubber, hydrin rubber, silicone rubber, ethylene-propylene-diene terpolymers, any copolymers thereof, or any combination thereof.

In an exemplary embodiment, the polymer includes acrylonitrile butadiene styrene (ABS), polycarbonate (PC), polylactic acid (PLA), high density polyethylene (HDPE), polyphenylsulfone (PPSU), poly(meth)acrylate, polyetherimide (PEI), polyether ether ketone (PEEK), high impact polystyrene (HIPS), thermoplastic polyurethane (TPU), polyamides (nylon), composites thereof, or combinations thereof.

In at least one embodiment, the 3D printer 100 may include a monitoring system 130 capable of or configured to control and/or monitor one or more components or portions of the 3D printer 100, the formation of the article 118, one or more portions of the substrate 116, one or more areas proximal the substrate 116, and/or the deposition of the droplets. For example, the monitoring system 130 may include one or more illuminators (not shown) capable of or configured to measure droplet, build part, build plate, and substrate temperatures, measure build part shape and z-height, measure droplet size and rate, or the like, or any combination thereof. Illustrative illuminators may be or include, but are not limited to, lasers, LEDs, lamps of various types, fiber optic light sources, or the like, or combinations thereof. In another example, the monitoring system 130 may include one or more sensors (not shown) capable of or configured to measure a temperature of one or more components or portions of the 3D printer 100. Illustrative sensors may be or include, but are not limited to, pyrometer, thermistors, imaging cameras, photodiodes, or the like, or combinations thereof. The monitoring system 130 may also be capable of or configured to provide feedback or communicate with the computing system 108.

In at least one embodiment, any one or more components of the 3D printer 100 may move independently with respect to one another. For example, any one or more of the printhead 104, the stage 106 and the platen 128 coupled therewith, the targeted heating system 102, the monitoring system 130, or any combination thereof may move independently in the x-axis, the y-axis, and/or the z-axis, with respect to any one or more of the other components of the 3D printer 100. In another embodiment, any two or more of the components of the 3D printer 100 may be coupled with one another; and thus, may move with one another. For example, the printhead 104 and the targeted heating system 102 may be coupled with one another via a mount (not shown) such that the movement or translation of the printhead 104 in the x-axis, the y-axis, and/or the z-axis results in a corresponding movement of the targeted heating system 102 in the x-axis, the y-axis, and/or the z-axis, respectively. Similarly, the targeted heating system 102 and the stage 106 may be coupled with one another via a mount (not shown) such that the movement of the targeted heating system 102 in the x-axis, the y-axis, and/or the z-axis results in a corresponding movement of the stage 106 in the x-axis, the y-axis, and/or the z-axis, respectively.

In certain embodiments, various build materials may influence particular design considerations based on the printing material properties and composition, particularly at jetting temperature. Molten metal and/or molten polymer-based printing materials may have differing viscosity, surface tension, and other properties at jetting temperature that impact and influence nozzle design and other printing system parameters such as magnetic field settings, electrical current settings, as well as other parameters that influence the forces applied to the molten or liquid printing material to create pressure at the nozzle 124. Likewise, aqueous-based materials may require still other design considerations to create pressures at the nozzle 124 suitable for printing in various drop-on-demand printing and drop ejection configurations.

Nozzle Design for Pulsed Droplet Ejection Systems

In certain embodiments of a DOD ejection system, or DOD printer, the nozzle is designed to control fluid flow and eject droplets with consistent characteristics (shape/volume/speed) to meet a required throughput (mass ejected per unit of time). The application for which the nozzle is designed drives the desired droplet characteristics; for example in 3D printing systems large/bulky droplets may be undesirable because of the agility required to print complex geometric objects, whereas in liquid dosage applications larger droplets are more suitable. Throughput requirements are set to make the droplet ejection system economically attractive for the application.

It is known to those skilled in the art that printing irregularities may arise due to unpredictable speed, shape, and volume of the droplets generated by the nozzle, in lieu of the constant nominal values expected by design. These irregularities may be attributable to the forces required within a nozzle to eject a printing material in terms of both the dynamics of the liquid in the tank feeding the nozzle and the time it takes for the liquid inside the nozzle to become quiescent, since both attributes alter the initial condition and pressure signal under which each new droplet is generated.

In certain embodiments, the system inputs related to throughput and droplet characteristics may ultimately dictate the available frequency at which the nozzle must eject consistent droplets. The firing frequency necessary for stable drop-to-drop behavior may be further influenced by the time it takes for the meniscus, or the boundary between fluid and atmosphere at the nozzle orifice, to settle after droplet ejection, thus dictating that a drop should ideally be ejected when the meniscus is quiescent. Droplets fired after the meniscus is quiescent show more consistent characteristics, whereas ejecting droplets at frequencies faster than the reciprocal of the settling time can result in significant drop-to-drop variation. Thus, the nozzle must be designed such that the settling time of the meniscus after droplet ejection, henceforth labeled the relaxation time, is small enough to permit a desired firing frequency. A method for designing a nozzle to simultaneously control the relaxation time and droplet characteristics upon ejection is advantageous in certain embodiments. An optimized nozzle may be designed by decoupling the problem of controlling the relaxation time from the problem of shaping the droplet in an ejector nozzle.

Figures 2A, 2B:
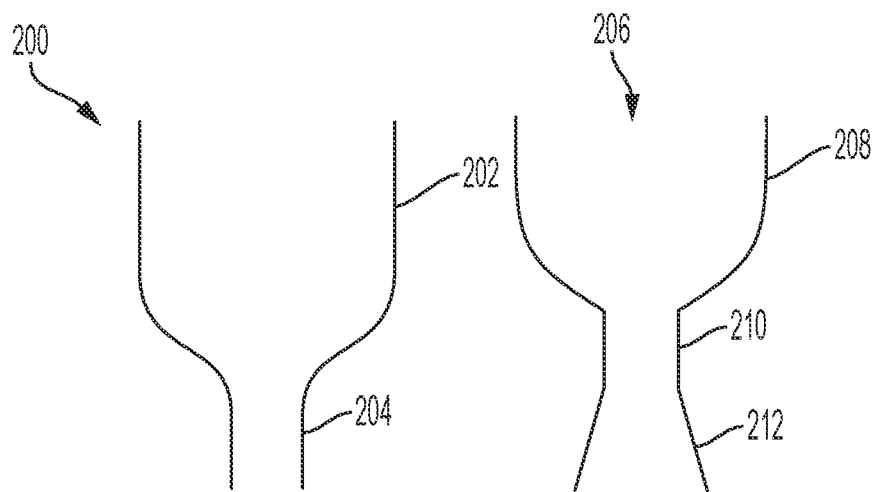
FIG. 2A illustrates a schematic cross-sectional view of a prior art conventional nozzle design.
FIG. 2B illustrates a schematic cross-sectional view of an exemplary nozzle design, according to one or more embodiments disclosed.

FIG. 2A illustrates a schematic cross-sectional view of a prior art conventional nozzle design. The general structure of the nozzle 200 includes a tank 202 and a tip 204. FIG. 2B illustrates a schematic cross-sectional view of an exemplary nozzle design, according to one or more embodiments disclosed. In an exemplary embodiment the nozzle 206 consists of three contiguous sections—the upper tank section 208, where the liquid material is stored, a dissipative section 210, designed to enable a desired maximum frequency with which droplets can be ejected, and a shaping section 212, also referred to as a shaping tip, capable of ejecting droplets with consistent characteristics regarding shape and size. Certain embodiments of printers as described herein may have a collection of one or more such nozzles 206 arranged and configured to eject droplets simultaneously, such that the ejected droplets may combine to form a single droplet. In embodiments described herein, a method for designing a dissipative section 210 capable of dissipating energy based on obstructing the fluid flow through the dissipative section may be employed, by determining a combination of shaping the nozzle geometry with constricted passages to the fluid flow, introducing a porous obstacle to the fluid flow, or combinations thereof. In embodiments described herein, the dissipative section may be an axisymmetric portion of the nozzle between the tank and the shaping tip or shaping section.

In the embodiment shown in FIG. 2B, an exemplary nozzle has a tank in communication with a dissipative section, and a shaping section in communication with the dissipative section, which is also in communication with a shaping section. The function of the dissipative section of the nozzle is to dissipate fluid energy and increases the momentum loss, which in turn increases a meniscus damping rate and hence decreases the relaxation time. The relaxation time, t, is defined as the time it takes for a deformation of a meniscus of liquid printing material at a front plane face of a nozzle to return to a quiescent state after a drop of printing material is jetted. The relaxation time, t, is the time required for an exponentially decreasing variable, in this case, the amplitude of a damped oscillation, to decrease from an initial value to 1/e or 0.368 of that initial value (where e is the base of natural logarithms). This value can be considered a consistent index for measuring the time it takes for a meniscus at a nozzle face to return to a static equilibrium. The shaping section is designed to generate teardrop shaped droplets with a prescribed volume and center of mass velocity, as compared to elongated droplets which are simpler to generate. The cooperative design of the two sections permits concurrent controlling of the speed of the center of mass of each droplet and the number of droplets formed per pulse. A pulse may be understood to be pressure signal on the upper end of the nozzle intended to eject one or more droplets from the nozzle.

Design of the Dissipative Section

In certain embodiments, dissipative sections with constant cross section may be considered for purposes of establishing design parameters, although constant cross-sections are not required. The design parameters of the dissipative section are an axial length, a channel cross-sectional area A, and a perimeter S of the cross section. The relaxation time $\tau$ is proportional to $A\delta/S$, where $\delta$ is a characteristic length for the boundary layer inside the dissipative section. Therefore, the relaxation time $\tau$ is proportional to a constant cross-sectional area of the dissipative section. Two alternate examples may be considered for parameters related to the dissipative section. First, for a sufficiently long cylindrical dissipative section with a fully developed boundary layer (i.e., the flow velocity has an unchanging parabolic profile) and a cross sectional radius $r_n$, $\tau \propto \pi r_n^2$ n $r_n/(2\pi r_n) = r_n^2/2 \propto A$. A second example may be a section or channel made of one or more sets of two parallel plates walls of length L at a distance d<<L wherein the section or channel defines a fully developed boundary layer such that $\tau \propto Ld^2/(2(L+d)) \propto d^2$. Therefore, $\tau$ can be set by appropriately choosing geometric parameters that define the cross-sectional area in the dissipative section. The relaxation time is largely independent of the length of the dissipative section and as such the dissipative section should be long enough to be manufacturable and rigid. When the nozzle is operating in a steady state, the amount of fluid travelling through the dissipative section to reach the shaping section should at least be equal to the mass of the ejected droplet. In certain embodiments, some additional fluid could flow as well, and later flow back into a pump or reservoir in communication with the tank portion of the nozzle. In certain embodiments, the parameters selected for the dissipative section design are chosen to control the relaxation time of the meniscus at the exit orifice of a nozzle.

In certain embodiments, it is desirable to eject a single droplet that does not split into satellite droplets. To avoid this, the velocities inside the droplet should not be too different from that of the droplet's center of mass. The kinetic energy that the droplet carries with it is roughly proportional to the mass of the droplet times the velocity of the center of mass squared. If the fluid travels through the dissipative section faster than the expected velocity of the droplet, the excess kinetic energy it carries with it should be dissipated after the droplet is ejected. The larger the fluid speed through the dissipative section, the more energy that needs to be dissipated, the larger the energy cost of operating the nozzle, and the longer the time it takes to have oscillations of the meniscus decay to an acceptable level, and hence the lower the operating frequency. Therefore, the speed of the fluid through the dissipative section should not be much larger than the desired speed of the center of mass of the ejected droplet. Additionally, in steady operation, the fluid already in the shaping section would have speeds near zero at the beginning of each pulse, and it should be accelerated to the desired speed of the droplet to be ejected. If the speed of the fluid through the dissipative section is too large, the increase in pressure and the viscous forces in the shaping section are not enough to accelerate the fluid therein, which may result in multiple droplets being ejected, or in a droplet that breaks apart soon after being ejected, or simply in a very elongated droplet of a small diameter. At the same time, the fluid that travels through the shaping section should have a large enough speed and hence kinetic energy to inflate the meniscus, so the speed of the fluid through the dissipative section has to necessarily be larger than the desired speed of the center of mass of the droplet. Given the qualitative relationship between the fluid velocity in the dissipative section, the meniscus settling time, and the droplet speed, we use a classical idea in fluid dynamics to design the dissipative section, i.e., obstructing the flow of a fluid can be used to control pressure drops and velocity changes. In embodiments described herein, obstructions may be realized by choking or constricting the fluid motion as seen in Venturi nozzles, and/or alternatively by the incorporation of permeable media within in the dissipative section. The dissipative section of embodiments of nozzles as described herein may be designed or constructed mechanically, physically, using a computer processor, using computer modeling, using computer simulation, or combinations thereof.

Figure 3:
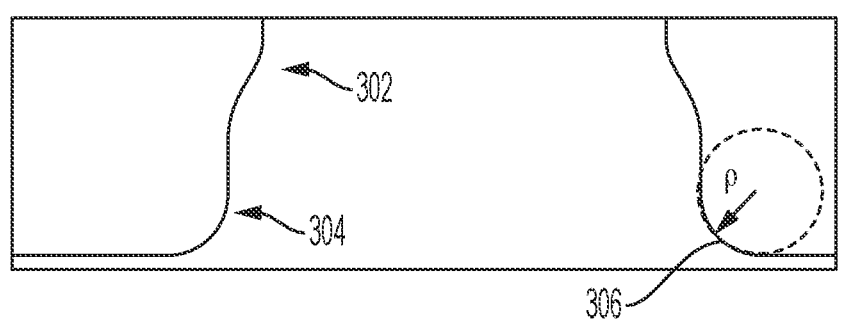
FIG. 3 illustrates a schematic cross-sectional view of a portion of a nozzle design, according to one or more embodiments disclosed.

FIG. 3 illustrates a schematic cross-sectional view of a portion of a nozzle design, according to one or more embodiments disclosed. An exit portion of the dissipative section 302 is shown leading to an exit orifice 304 of the shaping section, the exit orifice having a radius of curvature, ρ, 306 that influences nozzle design. In certain embodiments the length and dimensions of a transition zone between the dissipative section and the shaping section also influences the dissipation of energy within a fluidic printing material moving through a nozzle. In certain embodiments the dissipative section 302 cross-sectional area is smaller the cross-sectional area of the exit orifice 304. The radius of curvature, ρ, 306 at the exit orifice 304 defines the dynamics of the meniscus, which will be described in further detail later.

Figure 4A:
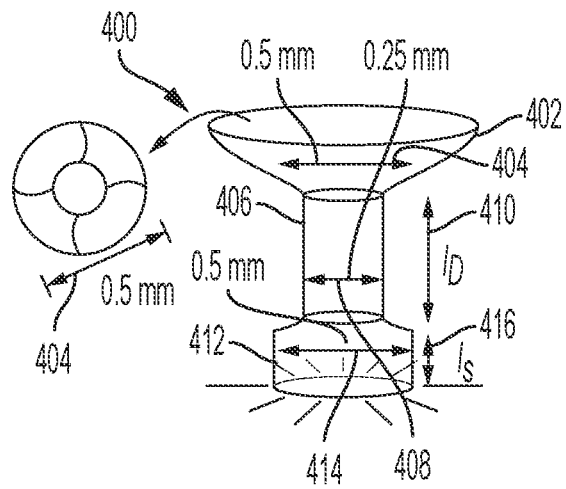
FIGS. 4A-4D illustrate several multi-sectional nozzles, according to one or more embodiments disclosed.

FIGS. 4A-4D illustrate several multi-sectional nozzles, according to one or more embodiments disclosed. FIG. 4A shows an axisymmetric nozzle embodiment having a constricted channel dissipative section. The dissipative section is designed as a constriction as compared to the diameter of the tank and the diameter of the shaping section. Given the requirement that the jetted fluid printing material needs to slow down after exiting the dissipative section, conservation of mass indicates that the dissipative section must open out to increase the cross-sectional area in the shaping section. As a pressure pulse is applied to the printing material at the top of the tank, the liquid in the dissipation section attains a very large momentum as compared to the velocity target. Consequently, the liquid in the shaping section is subjected to pressure. If the speed is too high and the cross-sectional area between the dissipative section and shaping section is small, the droplet ejected from the nozzle has very large dispersion in its initial velocity field. Particles in such a droplet therefore may move with different velocities too high and too low as compared to targeted values. Droplets behaving in this manner are susceptible to having unacceptable shape may likely break up before reaching the substrate. To counteract these undesirable effects and maximize droplet uniformity, the liquid in the shaping section that is to be ejected must be equally accelerated from the pushing coming from dissipative section. One way to accomplish this is to increase the cross-sectional area, i.e., the area that connects the two sections. An additional advantage of increasing this cross-sectional area is that the undesirable high speeds generated in the dissipation section may be slowed down. While constricted nozzles are known to those skilled in the art, the utilization of a constrictive dissipation section in combination with a corresponding shaping section in DOD printing applications to control the meniscus oscillation and droplet characteristics as described herein provides advantages. FIG. 4A illustrates an axisymmetric constricted nozzle 400 having a tank 402 having a given diameter 404 as indicated. The tank 402 is a reservoir or receptacle for liquid or molten printing material, which is not included in this view. The tank 402 is in fluid communication with a dissipative section 406, which in this embodiment is shown as a cylinder. This cylindrical dissipative section 406 defines a diameter 408 which is indicated as being a smaller diameter 408 than the indicated diameter 404 of the tank 402. The cylindrical dissipative section 406 further defines a length, $l_D$ 410. Printing material is fed from the tank 402 to the cylindrical dissipative section 406 via gravity, positive pressure, or other means known to those skilled in the art. The cylindrical dissipative section 406 is in fluid communication with a shaping section 412. The shaping section 412 also defines a diameter 414 which is indicated as being a larger diameter 414 as compared to the diameter 408 of the cylindrical dissipative section 406. The shaping section 412 further defines a length, $l_S$ 416. This provides a nozzle 400 having a geometrically constricted dissipative section 406 as compared to the tank 402 and the shaping section 412. It is understood that the meniscus of a printing material being jetted by such a nozzle settles faster in a constricted nozzle as compared to an unconstricted one.

Figure 4B:
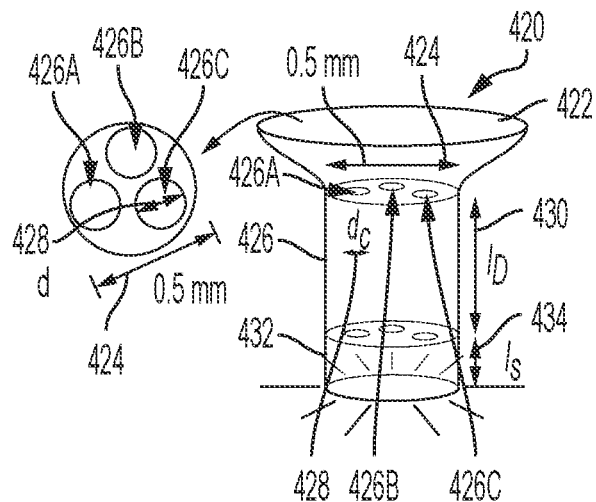

FIG. 4B shows a nozzle embodiment having a "shower-head" channel dissipative section. This may also be referred to as a dissipative channel having at least two multiple internal channels. The exemplary embodiment of the shower-head channel nozzle 420 defines a tank 422 having a given diameter 424 as indicated. The tank 422 is a reservoir or receptacle for liquid or molten printing material, which is not included in this view. The tank 422 is in fluid communication with a dissipative section 426, which in this embodiment is overall shown as a cylinder. The dissipative section 426 includes three individual internal elongated cylindrical channels. While three channels 426A, 426B, 426C are illustrated in this embodiment, alternate embodiments may include as few as two internal channels, as many as ten internal channels, or possibly more as determined by the requirements of the nozzle design dictated by the dimensions and balances between system parameters. Each internal cylindrical channel 426A, 426B, 426C has a channel diameter $d_C$ 428 which is indicated as being a smaller diameter 428 than the indicated diameter 424 of the tank 422, as well as smaller than the overall diameter of the entire dissipative section 428 (which is not indicated here). While the three internal channels 426A, 426B, 426C illustrated in this embodiment are shown to have the same diameter, alternate embodiments of nozzles may have differing diameters depending on system requirements. The dissipative section 426 further defines a length, $l_D$ 430. Printing material is fed from the tank 422 to the dissipative section 426 via gravity, positive pressure, or other means known to those skilled in the art. The dissipative section 426 and in particular the three internal channels 426A, 426B, 426C are in fluid communication with a shaping section 432. It should be noted that the three internal channels are not in direct communication with one another, but they are each in communication with the tank 422 and with the shaping section 432 of the nozzle 420 of FIG. 4B. The shaping section 432 also defines a diameter 434 which is indicated as being a similar diameter 434 as compared to the overall diameter of the dissipative section 426 yet larger than the channel diameter $d_C$ 428 of each of the three internal channels 426A, 426B, 426C, whether taken individually or combined, of the dissipative section 426. The shaping section 432 further defines a length, $l_S$ 434. This provides a nozzle 420 having a geometrically constricted dissipative section 426 as compared to the tank 422 and the shaping section 432, regardless of the overall diameter of the nozzle 420 itself. Such obstructions to the fluid flow as a dissipative section with narrow channels having a cumulative cross-sectional area comparable to other nozzle embodiments described herein, distribute the dissipative section, providing a more uniform push of the fluid already in the shaping section and therefore of the meniscus. This may facilitate the ejection of single droplets from a nozzle with a larger flexibility in terms of choosing pressure signals. As all channels in the nozzle 420 have a circular cross-section, the relaxation time scales with the sum of the areas of the internal channels 426A, 426B, 426C.

Figure 4C:
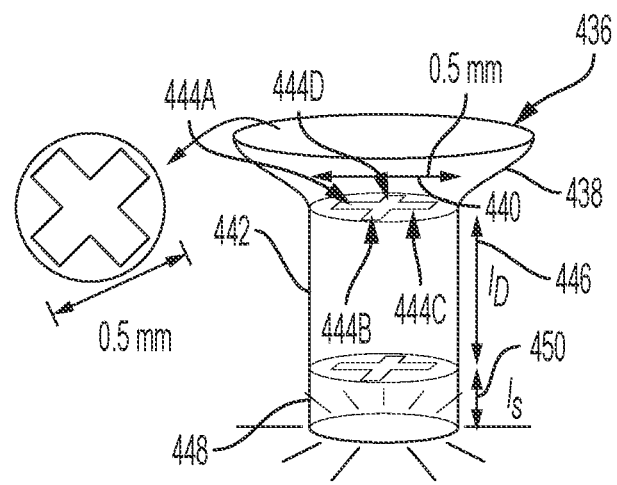

FIG. 4C shows a nozzle embodiment having a "cross-channel" dissipative section. This may also be referred to as a dissipative channel having multiple axisymmetric parallel plate channels. This embodiment of the cross-channel nozzle 436 defines a tank 438 having a given diameter 440 as indicated. The tank 438 is a reservoir or receptacle for liquid or molten printing material, which is not included in this view. The tank 438 is in fluid communication with a dissipative section 442, which in this embodiment is overall shown as a cylinder. The dissipative section 442 includes a first set of parallel plates 444A, a second set of parallel plates 444B, a third set of parallel plates 444C, and a fourth set of parallel plates 444D. Each of the four sets of parallel plates 444A, 444B, 444C, 444D are interconnected along a length of the dissipative section 442, thus forming four interconnected channels. This "cross-channel" constricted dissipative section has two intersecting channels that are substantially perpendicular to one another and the two intersecting channels have two walls that are parallel to one another. Alternate embodiments may have three, or more intersecting channels are arranged at substantially 45-degree angles around an axis of the constricted dissipative section. While four sets of parallel plates 444A, 444B, 444C, 444D evenly spaced around a center axis of the dissipative section 442 at approximately 90 degrees from one another are illustrated in this embodiment, alternate embodiments may include as few as two internal channels, as many as ten internal channels, or possibly more as determined by the requirements of the nozzle design dictated by the dimensions and balances between system parameters. Furthermore, alternate embodiments may be spaced about a center axis from about 10 degrees from one another to about 345 degrees from one another and need not be evenly spaced. Each internal channel defined by the four sets of parallel plates 444A, 444B, 444C, 444D has a channel distance between each of a set of parallel plates, not indicated here, which is a smaller distance than the indicated diameter 440 of the tank 438, as well as smaller than the overall diameter of the entire dissipative section 442 (which is not indicated here). While the four sets of parallel plates 444A, 444B, 444C, 444D illustrated in this embodiment are shown to have the same distance between each of the parallel plates forming the set, alternate embodiments of nozzles may have differing distances between each set of plates depending on system requirements. The dissipative section 442 further defines a length, lD 446. Printing material is fed from the tank 438 to the dissipative section 442 via gravity, positive pressure, or other means known to those skilled in the art. The dissipative section 442 and in particular the four sets of parallel plates 444A, 444B, 444C, 444D are in fluid communication with a shaping section 448. It should be noted that the four sets of parallel plates 444A, 444B, 444C, 444D are also in direct communication with one another, as well as with the tank 438 and with the shaping section 448 of the nozzle 436 of FIG. 4C. The shaping section 448 also defines a diameter, not indicated here, which is a similar diameter as compared to the overall diameter of the dissipative section yet larger than the distance between each set of the four sets of parallel plates 444A, 444B, 444C, 444D of the dissipative section 426. The shaping section 448 further defines a length, lS 450. This provides a nozzle 436 having a geometrically constricted dissipative section 442 as compared to the tank 438 and the shaping section 448, regardless of the overall diameter of the nozzle 436 itself. In an embodiment of nozzle 436 the dissipative section 426 obstructs fluid motion through the cross-shaped channel. The fluid through this section resembles flow between parallel plates, so the relaxation time scales as the square of the thickness of the cross. By adding more arms or sets of parallel internal walls or plates to the interconnected channels forming the cross, an asterisk for example, the overall area of the cross-channel of the dissipative section 426 can be increased without changing the relaxation time, making it possible to push the fluid more uniformly, decreasing the speed at which the fluid needs to transverse the dissipative section 426, and hence making a more robust and energetically efficient nozzle. In some embodiments, it may be assumed that the area of the cross-channel of the dissipative section 426 is smaller than the area of the exit orifice of the shaping section 448. In certain embodiments, the dissipative section of a cross-channel type nozzle may have six interconnected channels, eight interconnected channels, or more. While no theoretical limit to interconnected channels is known, the resulting total cross-sectional area should not exceed that of the shaping section as to maintain a constricted dissipative section.

Figure 4D:
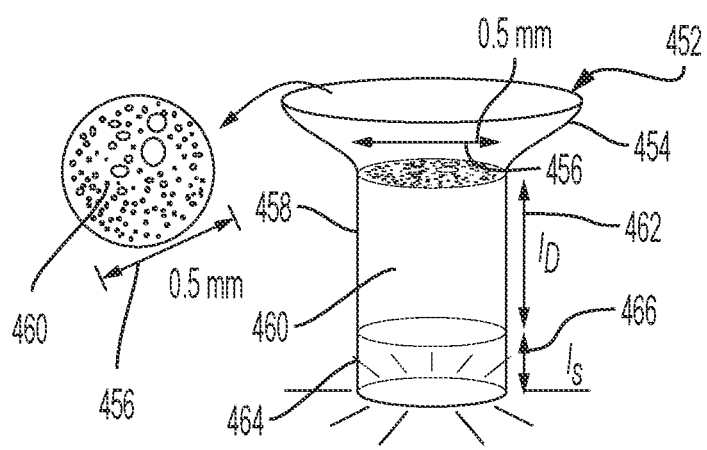

FIG. 4D shows a nozzle embodiment having an obstructive medium dissipative section. An exemplary embodiment of the obstructive medium nozzle 452 defines a tank 454 having a given diameter 456 as indicated. The tank 454 is a reservoir or receptacle for liquid or molten printing material, which is not included in this view. The tank 454 is in fluid communication with a dissipative section 458, which in this embodiment is overall shown as a cylinder. The dissipative section 458 includes obstructive media 460 which constricts fluid flow though the dissipative section 458 by having multiple random pathways or channels therethrough. The pathways through the obstructive medium 460 may be interconnected along a length of the dissipative section 458. Options for obstructive medium or otherwise porous media may include foam such as a polymeric foam, ceramic, or metal-based foam such as titanium foam, depending on the temperature and nature of the printing media. Furthermore, alternate embodiments may have varied permeability or porosity values depending on system requirements. The dissipative section 458 further defines a length, $l_D$ 462. Printing material is fed from the tank 454 to the dissipative section 458 via gravity, positive pressure, or other means known to those skilled in the art. The dissipative section 458 and in particular the obstructive medium 460 is in fluid communication with a shaping section 464. It should be noted that internal channels formed by the obstructive medium 460 may also be in direct fluid communication with one another, as well as with the tank 454 and with the shaping section 464 of the nozzle 452 of FIG. 4D. The shaping section 464 also defines a diameter, not indicated here, which is a similar diameter as compared to the overall diameter of the dissipative section 458 yet larger than the theoretical diameter of any combined channels within the obstructive medium 460 in the dissipative section 426. The shaping section 464 further defines a length, $l_S$ 466. This provides a nozzle 452 having a geometrically constricted dissipative section 458 as compared to the tank 454 and the shaping section 464, regardless of the overall diameter of the nozzle 452 itself. Unlike the geometric-based obstructions illustrated in FIGS. 4A-4C, the nozzle having an obstructive medium shown in FIG. 4D illustrates a nozzle which may provide energy dissipation by controlling the permeability properties of the medium.

Figure 5A:
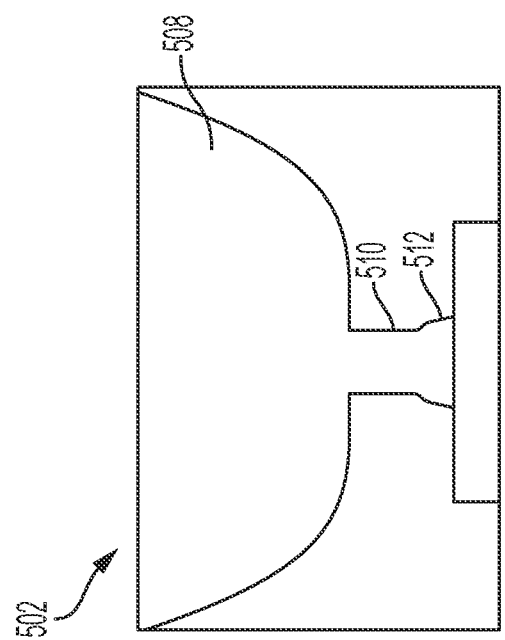
FIGS. 5A and 5B illustrate schematic cross-sectional side views of an unconstricted and a constricted nozzle design, respectively, according to one or more embodiments disclosed.
Figure 5B:
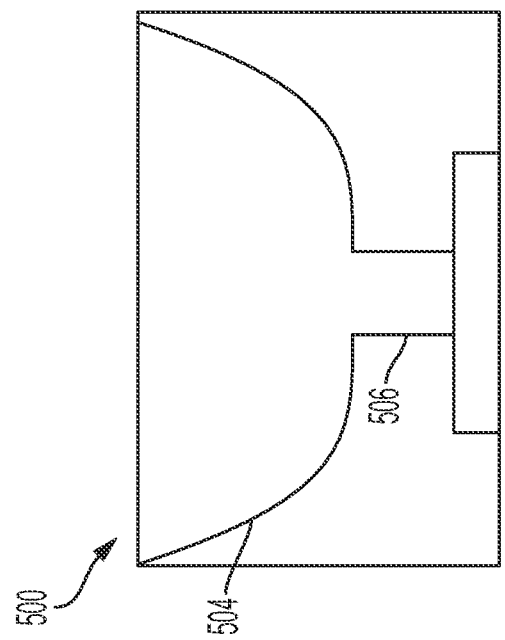

FIGS. 5A and 5B illustrate schematic cross-sectional side views of an unconstricted and a constricted nozzle design, respectively, according to one or more embodiments disclosed. FIGS. 5A and 5B illustrate the distinction between a standard unconstricted nozzle 500 of FIG. 5A and a constricted nozzle 502 with a dissipative section 510 designed as a constriction in FIG. 5B. The constricted nozzle 500 of FIG. 5A consists of a tank section 504 and a shaping section 506. In the unconstricted nozzle 500, the meniscus settling time and droplet characteristics cannot be independently controlled. FIG. 5B also defines a tank section 508, the constricted dissipative section 510, and a shaping section 512, showing a more generalized embodiments of the exemplary embodiments described herein. To illustrate and confirm the effect of the constriction on the relaxation time and the shape of the droplet under these various conditions, high-fidelity simulations that solve the governing equations of the fluid may be performed utilizing the open-source software OpenFOAM2, obtained from https://www.openfoam.com. Example simulations are described in the Examples and illustrated in FIGS. 6A and 6B for standard and constricted axisymmetric designs.

Figure 6B:
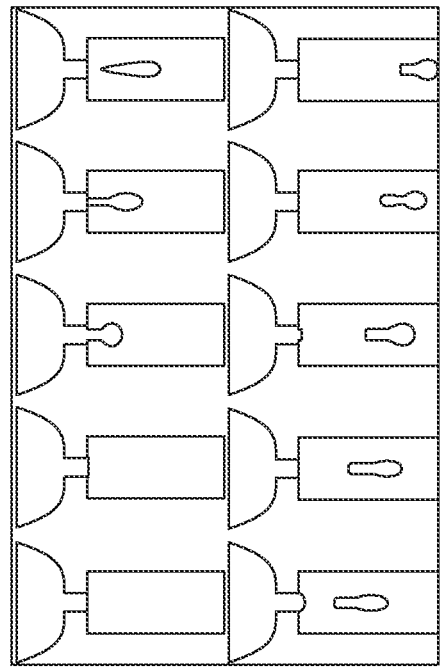
FIGS. 6A and 6B illustrate schematic cross-sectional side views of simulations generated using a standard and constricted axisymmetric nozzle design respectively, presented at various time instants, according to one or more embodiments disclosed.
Figure 6A:
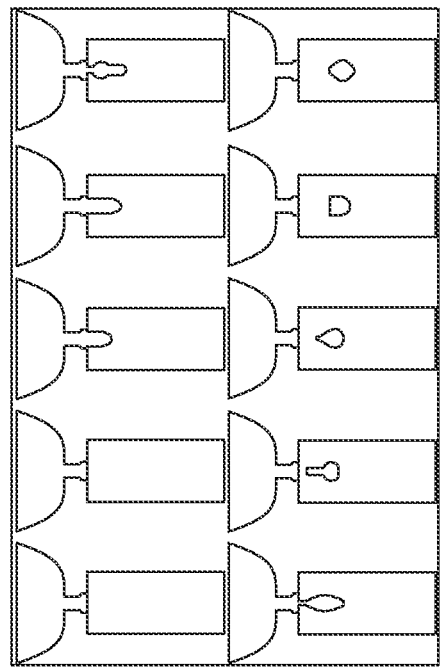

FIGS. 6A and 6B illustrate schematic cross-sectional side views of simulations generated using a standard and constricted axisymmetric nozzle design respectively, presented at various time instants, according to one or more embodiments disclosed. FIG. 6A shows a series of snapshots from an OpenFOAM2 droplet simulation study generated using a standard, or unconstricted channel nozzle. The successive images shown are representative of snapshots of the simulated droplets taken at times (t) where t=0, 0.1, 0.2, 0.3, 0.4, 0.5, 0.6, 0.7, 0.8, and 0.9 msec, respectively. FIG. 6B shows a series of snapshots from an OpenFOAM2 droplet simulation study generated using an axisymmetric or constricted channel nozzle. The successive images shown are representative of snapshots of the simulated droplets taken at times (t) where t=0, 0.1, 0.2, 0.3, 0.4, 0.5, 0.6, 0.7, 0.8, and 0.9 msec, respectively.

Figure 7:
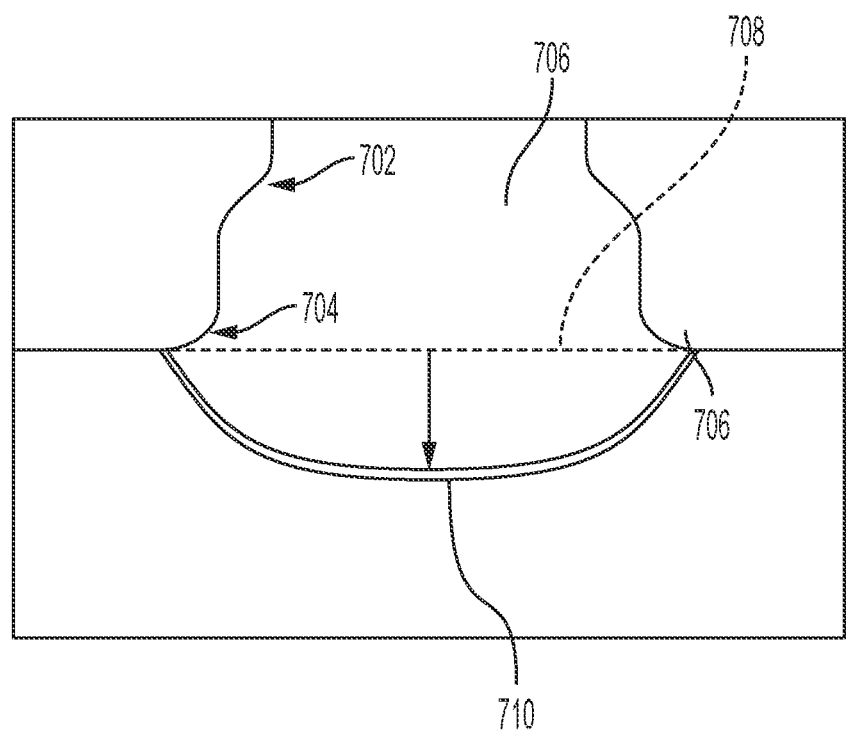
FIG. 7 is a cross-sectional side view illustrating the concept of meniscus displacement relative to a front face of an embodiment of a nozzle, according to one or more embodiments disclosed.

FIG. 7 is a cross-sectional side view illustrating the concept of meniscus displacement relative to a front face of an embodiment of a nozzle, according to one or more embodiments disclosed. Nozzle 700 has a general structure similar to other embodiments described herein and includes an exit portion of the dissipative section 702 shown leading to an exit orifice 704 of the shaping section of the nozzle 700. The nozzle 700 is filled with printing material 706, which may be jetted from the nozzle 700 when the nozzle 700 is included in an array of nozzles, printhead assembly, or printing system. A plane of a front face of the nozzle 708 is indicated as a reference point for the location of printing material 706 within a nozzle 700 at an ideally quiescent state. During printing operations, as a printing material is jetted from a nozzle and a droplet detaches, a position of meniscus displacement 710 is shown. This boundary and location of meniscus displacement 710 shows an interface boundary which oscillates as the printing material 706 still within the nozzle settles after droplet detachment. The time associated with this meniscus displacement and settling defines the relaxation time, t, associated with a particular nozzle design.

Figure 8:
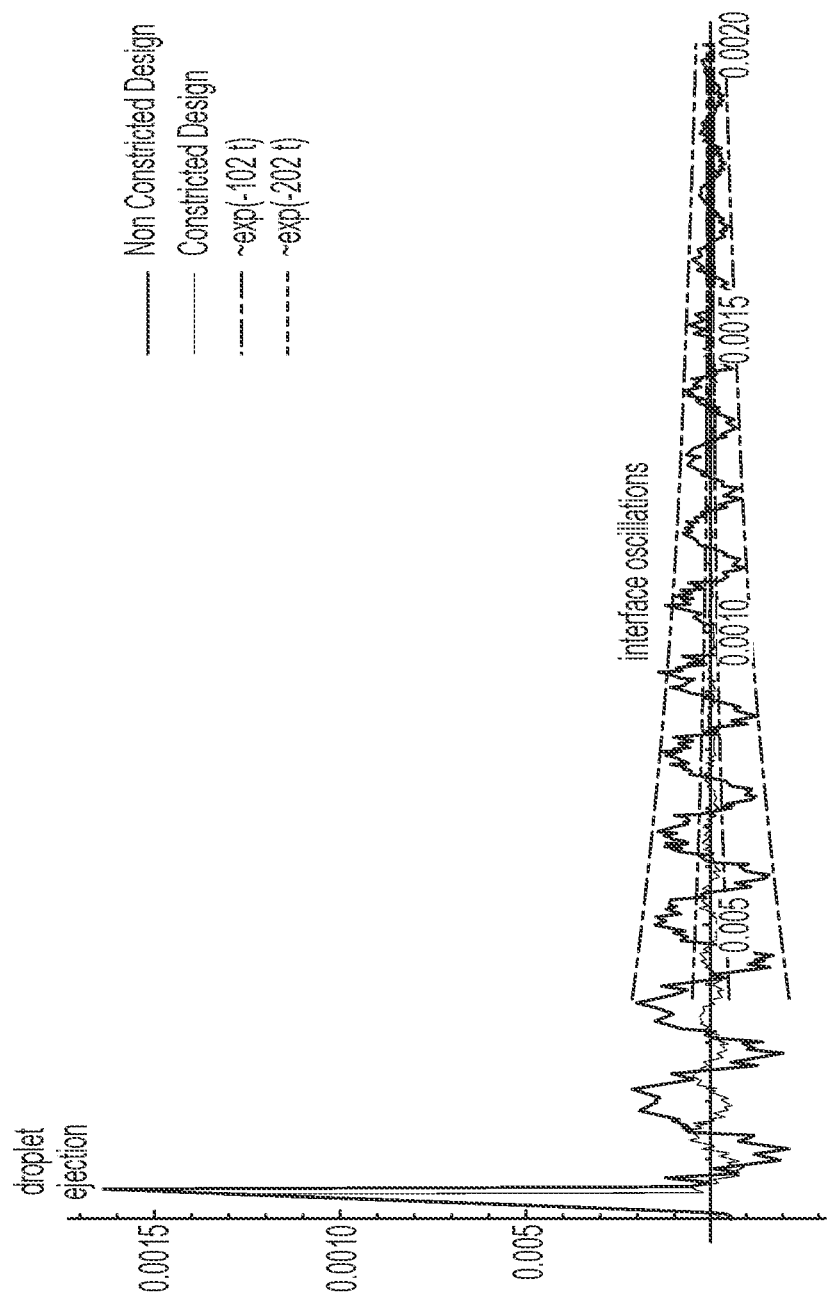
FIG. 8 is a plot illustrating a simulated meniscus displacement as a function of time for the ejection of one droplet from the constricted and unconstructed nozzle embodiments of FIGS. 6A and 6B.

FIG. 8 is a plot illustrating a simulated meniscus displacement as a function of time for the ejection of one droplet from the constricted and unconstructed nozzle embodiments of FIGS. 6A and 6B. Both the unconstricted nozzle and constricted nozzle curves illustrate the meniscus displacement and associated oscillations of the meniscus as it settles back to a plane of a front face of a nozzle as shown and described in regard to FIG. 7. The plot in FIG. 8 shows meniscus displacement as a function of time for the unconstricted nozzle and constricted nozzle. The plot in FIG. 8 also illustrates an exponential decay fitted to each curve for the unconstricted nozzle and constricted design nozzle, which defines the relaxation time, t, for both the unconstricted nozzle and constricted nozzle, respectively. The plot clearly shows the reduction of the relaxation time due to the constricted dissipative section in the constricted nozzle design as compared to the unconstricted nozzle design. Also observable is the reduced magnitude of the oscillations for the constricted dissipative section in the constricted nozzle design as compared to the unconstricted nozzle design.

Designing the Shaping Section

In certain embodiments, the required relaxation time of a nozzle design defines the ratio $A\delta/S$ for the dissipative section, where A is the dissipative section channel cross-sectional area, $\delta$ is a characteristic length for the fluid boundary layer inside the dissipative section, and S is the perimeter of the dissipative section cross-section. The value of $\delta$ is always smaller or equal than smallest characteristic dimension of the cross section, so its upper bound is also defined by the geometry. The required volume of the droplet and its speed define the cross-sectional area of the exit orifice of the shaping section of a nozzle. The volume of the droplet is approximately proportional to $R^3$, where R is the radius of the exit orifice in the shaping section. Therefore, if the velocity of the center of mass of the droplet is V, then the velocity inside the dissipative section should be $\approx V\pi R^2/A$. Since A can be chosen to be close to $\pi R^2$ by selecting a cross section for the dissipative section with an appropriate S, it is possible to design a nozzle such that this speed is very close to that of the center of mass. For example, in an embodiment according to a nozzle design as illustrated in FIG. 4C, the nozzle embodiment having a cross-channel dissipative section, if additional sets of parallel plates are increased from 4 to 6 set of parallel plates, A grows, but A/S remains roughly constant. This speed then defines the strength of the pressure signal to use when jetting printing material from a nozzle designed as described herein.

In regard to the shape of the exit orifice in certain embodiments, several possible shapes could be considered, such as an elliptical orifice or a narrow slit, but the circular orifice may be generally known to those skilled in the art as ideal in obtaining a single droplet per pulse. Therefore, the following discussion is based on an exit orifice of circular shape. In certain embodiments, the diameter of the exit orifice of the shaping section dictates the droplet volume and shape ejected from a nozzle. In the instance of a very small diameter a long droplet would need to be generated by the nozzle to attain a given mass, and such droplet would be ejected before reaching such mass. An analogous argument can be made about a large diameter, in that a larger diameter nozzle may require a waveform having a longer pushing time, which could result in elongated droplets of unacceptable shape. Thus, a mechanism to prevent the meniscus edge of a droplet from moving beyond the plane of the front face of the exit orifice is needed. In some embodiments, this can be implemented with the use of a sharp edge, a sharp surface irregularity, or a modification of the contact angle properties of the printing material. The radius of curvature, $\rho$, at the exit orifice, as shown and described in regard to FIG. 3 defines the dynamics of the meniscus. If this radius of curvature, $\rho$, is very small with respect to the radius of the exit orifice, then the meniscus will be largely pinned to the edge of the exit orifice. If the radius of curvature, $\rho$, is a significant fraction of the radius of the exit hole (for example, 10%), then the meniscus will move up and down the curvature of the exit orifice to a greater extent as it oscillates after the droplet is ejected from the nozzle. Therefore, the radius of curvature, $\rho$, in certain embodiments, may be less than 10 percent of the radius of the exit orifice in terms of controlling meniscus behavior at the exit orifice.

In certain embodiments of a nozzle design, the length of the shaping section influences several factors. A very long shaping section in a nozzle can result in the ejection of two droplets: a slow one due to pressure generated by the incoming printing material fluid, and a second one if the jet of fluid entering the shaping section from the dissipative section is not sufficiently slowed down or dissipated. In other embodiments, when a shaping section is of an intermediate length, the shaping section design provides a way for the incoming printing material fluid to increase the pressure in the shaping section and push the printing material fluid presently in the shaping section to form a larger droplet. For a printing material fluid with large enough viscosity, the length of the exit region may be tailored to homogenize the velocity of the fluid before forming the droplet. The practice of this design strategy may be impractical for aluminum, a material of interest in DOD 3d printing applications. As stated previously, the exit orifice of the nozzle may provide a stable equilibrium of the meniscus, particularly if the contact angle of the fluid is wetting in contact with the nozzle. Further, if the area of the cross-section of the dissipative section is smaller than that of the exit orifice, then the exit of the dissipative section can provide a second stable equilibrium with smaller potential energy. Therefore, the length of the shaping section may provide a potential energy barrier to prevent the meniscus from traveling from the exit orifice to the exit of the dissipative section during jetting operations. This described balance between the design of the shaping section and the design of the dissipative section to minimize the relaxation time, $\tau$, of the nozzle may also be utilized and leveraged in nozzle design to prevent vortices and recirculation spots from forming within the nozzle if the fluid is viscous enough. This is not the case for Aluminum, or water. Water or alloy materials used in metal printing are not very viscous and hence prone to complex phenomena that occur at the intersection of dissipation and shaping sections while applying pressure pulses. One phenomenon is secondary vector fields or vortices that develop and perturb the desired vertical motion. Another phenomenon observed is that due to low viscosity the meniscus at a nozzle face may, after an ejection, retract and settle at a different position than the tip of nozzle, such as an intersection between dissipative and shaping sections, or deep inside the nozzle. The shaping section of embodiments of nozzles as described herein may be designed or constructed mechanically, physically, using a computer processor, using computer modeling, using computer simulation, or combinations thereof. Furthermore, transition zone or inter-merging area between a dissipative section and a shaping section of embodiments of nozzles as described herein may be designed or constructed mechanically, physically, using a computer processor, using computer modeling, using computer simulation, or combinations thereof.

Since the relaxation time, $\tau$, of a nozzle scales with the dimensions of the dissipative section, a smaller dissipative section leads to a faster relaxation time, resulting in less disturbance at the meniscus during jetting. However, this constraint on smaller diameter of the dissipative section also limits the volume of the droplet. Alternate embodiments of printing systems utilizing principals of nozzle design as described herein may include arrays of multiple nozzles having a small relaxation time placed close enough to one another such that the generated droplets merge while falling, and thus the overall volume of a droplet jetted can be increased by combining multiple nozzles while retaining a small relaxation time. In certain embodiments, droplets may merge into a single larger droplet if the amplitude of the transversal oscillations of the droplet shape while falling is larger than the distance between the nozzles. The pressure signal for multiple nozzles in parallel can be adapted from that of a single nozzle with little or no modifications. This described embodiment is analogous to the example of the nozzle having a shower-head channel dissipative section as illustrated in FIG. 4B without the shaping section. This is an example of a use of multiple nozzles jetting in parallel, provided the channels are placed close enough to each other.

Simulation Examples

The following Examples are being submitted to further define various aspects of the present disclosure. These Examples are intended to be illustrative only and are not intended to limit the scope of the present disclosure. Multiple test cases utilizing high-fidelity simulations of multi-sectional nozzle designs are conducted and the resulting nozzle jetting behavior is monitored with respect to single and multiple droplet events. The two areas of focus are to highlight the effect of energy dissipation in printing/jetting throughput and evaluate basic parametric analysis to study the sensitivity of throughput metrics with respect to basic nozzle characteristics. The outputs of interest related to these simulations are droplet characteristics of interest, i.e., droplet speed, volume and shape, as well as energy dissipation metrics, i.e. relaxation time of meniscus displacement. The studies conducted in the example studies have been restricted to the constricted axisymmetric channel nozzle design and the shower-head multichannel designs, as illustrated in FIGS. 4A and 4B, respectively.

Figure 9:
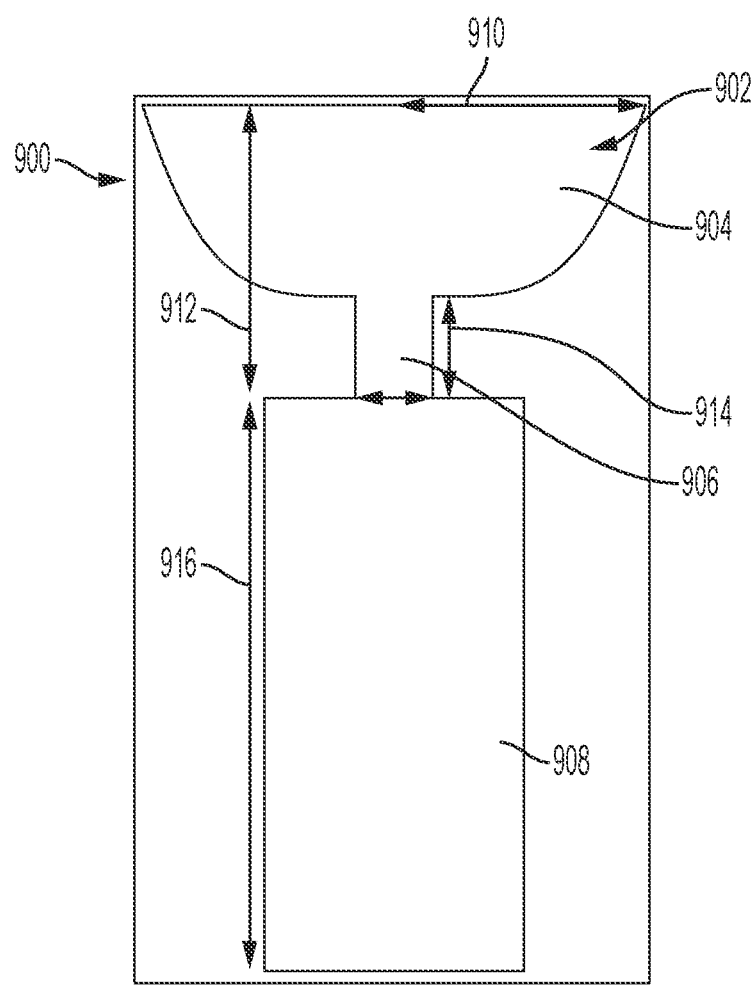
FIG. 9 illustrates a basic abstraction of the nozzle and substrate part of a printer embodiment.

FIG. 9 illustrates a basic abstraction of the nozzle and substrate part of a printer embodiment. A nozzle 900 defines a tank 902 and a constricted axisymmetric section 906 and is shown having fundamental dimensions—a radius 910 of the tank 902, a length 912 of nozzle 900, a length 914 of the constricted axisymmetric section 906, and a length 916 of a gas phase atmosphere 908 which are considered fixed for the simulations and two phases initialized, a liquid phase consisting of a model liquid printing material 904, and the gas phase 908. The first phase is liquid with properties resembling the ones of melted aluminum alloy at temperature above melting as a representative printing material. The second phase is gas with properties similar to an external atmosphere, for example, argon atmosphere. The values of the aforementioned properties used, are presented in Table 1. Finally, the contact angle between the wall of the nozzle and the liquid/gas interface, is assumed uniform and set to 60 degrees.

TABLE 1

| Gas/Liquid Phase Properties | | |
| --- | --- | --- |
| Phase | Gas | Liquid |
| Viscosity (m$^2$/s) | $2.59 \cdot 10^{-5}$ | $4.16 \cdot 10^{-7}$ |
| Density (kg/m$^3$) | 1.6228 | 2435.04 |
| Surface Tension (N/m) | 0.585 | 0.585 |

Figure 10:
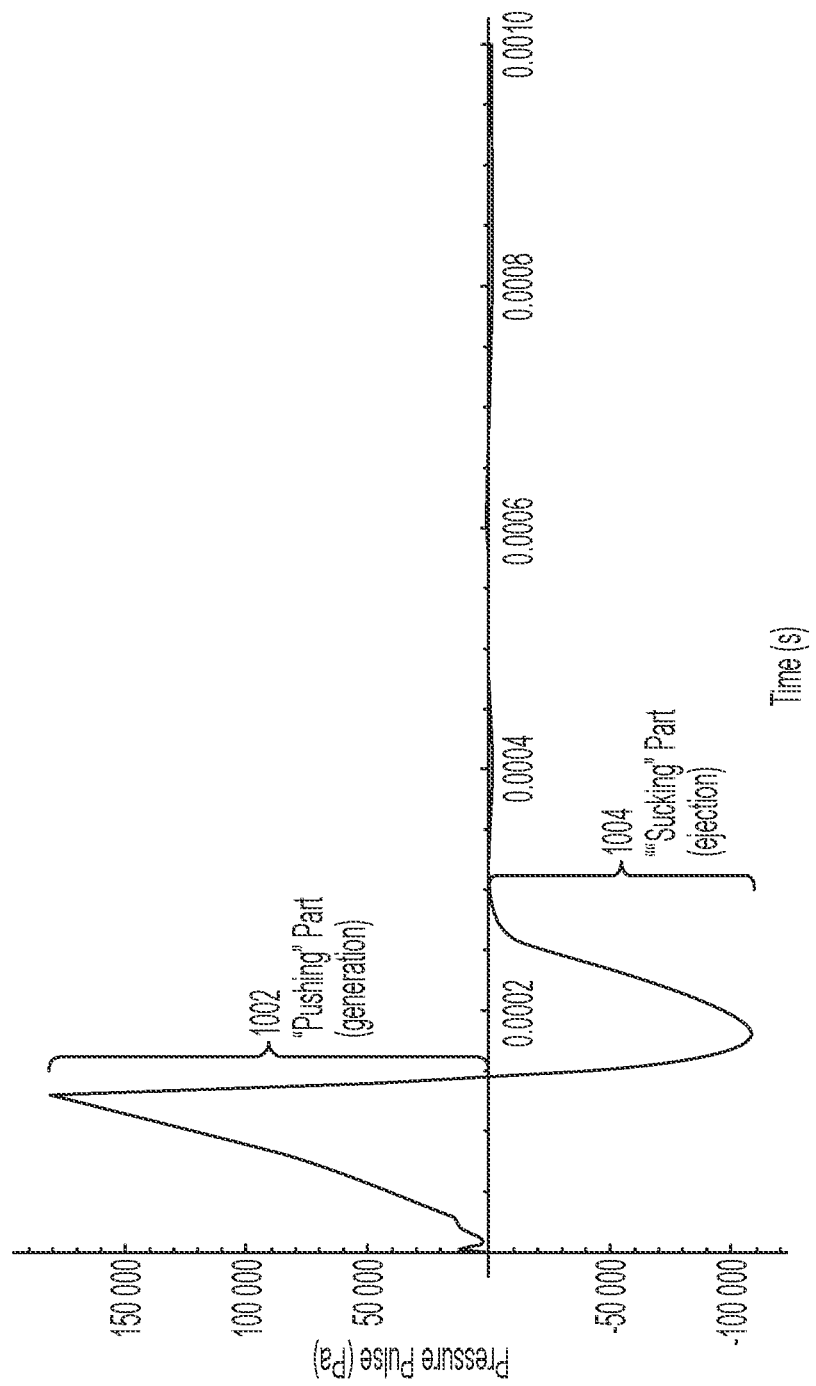
FIG. 10 illustrates a plot of a waveform representative of a pressure pulse applied at an upper boundary of a nozzle, according to embodiments herein.

FIG. 10 illustrates a plot of a waveform representative of a pressure pulse applied at an upper boundary of a nozzle, according to embodiments herein. This input signal is a pressure pulse applied at the upper boundary of the nozzle, set at 4.5 mm from a substrate. The signal has the incoming pulsed waveform illustrated in FIG. 10. It consists of a positive pressure (pushing) component 1002 and a negative pressure (sucking) component 1004. The positive pressure component of the waveform may be referred to as a generation event, or the positive generation portion of the waveform and generates the droplet while the negative pressure component of the waveform, which may also be referred to as an ejection event, or a negative ejection portion of the waveform, component controls its detachment from the orifice. To operate the nozzle and eject droplets with prescribed shape, volume, and speed, an appropriate pressure pulse waveform or signal in time at an interface between the tank and dissipative section is required. Such signals may consist of two clearly identifiable sections in time, an initial push followed by a pull, as illustrated in FIG. 10. The push section compresses the fluid in the tank and pushes it through the dissipative and shaping section of the nozzle, inflating the meniscus at the exit orifice of the shaping section. The pull section sucks the fluid within the nozzle and may slow it down, generating a sharp variation of the velocity of the fluid near the exit orifice. Accordingly, the fluid in the inflated meniscus continues moving forward away from the nozzle, but the fluid still within the nozzle is slowed down by the pull component of the waveform. This generates a breakup point from where the droplet detaches near the exit orifice. If the speed of the fluid within the meniscus is large enough, a droplet may emerge without the need for a pull section; and the meniscus then stretches to the point that a concave region with low pressure appears and the droplet breaks up from there. The pull section of the signal enables a degree of control of when and how the droplet detaches from the fluid in the nozzle. The speed, volume, and number of droplets per pulse within a range can be calibrated by tailoring the strength and duration of each part of the pressure signal.

Monitored quantities in the simulation examples include observations related to the generation of single droplets of candidate nozzle designs according to embodiments herein. Given a nozzle geometry and input signal, it is verified that: (a) a single droplet is generated, the droplet is of appropriate shape (close to spherical), and (b) the droplet remains a single droplet (i.e., without splitting into smaller droplets) throughout its trajectory. Droplet volume as a surrogate of droplet mass is quantified as well. As the model printing material fluids are incompressible for this application, volume is a conserved quantity. Droplet velocity is recorded as the volume-averaged velocity, which is the velocity of the center of mass of the droplet. It is considered constant due to the negligible effect of gravity. Meniscus relaxation time is the characteristic time r in the exponential fitting C exp(−t/τ) of the envelope of the time variation of the meniscus displacement after a droplet is ejected, as shown in FIG. 8. The relaxation time is a measure of how fast the excess kinetic energy of the fluid inside the nozzle is dissipated. A computational fluid dynamics (CFD) solver is used to execute a simulation in the OpenFOAM platform, implementing the InterFoam routine. This routine is a solver for two incompressible, isothermal immiscible fluids using a volume-of fluid numerical approximation.

For the constricted axisymmetric nozzle design simulation, a single droplet event includes one pressure pulse applied at the top of the upper tank, thereby ejecting one droplet. FIGS. 6A and 6B present snapshots of standard and constricted nozzle designs, respectively, satisfying the axisymmetric hypothesis. The system response is monitored by recording the trajectory of the interface by plotting the maximum displacement, as illustrated in FIG. 7 as a function of time, which yields plots similar to the plot illustrated in FIG. 8. The resulting plots show free meniscus oscillations after droplet ejection recorded for both a standard and a constricted nozzle design. In both simulations, an initial spike indicates the moment of droplet generation and break-up, followed by the damped oscillations as the meniscus relaxes. The data associated with the unconstricted design is a realization of a freely oscillating meniscus after a single droplet ejection in a standard (unconstricted) nozzle. In this particular case, the nozzle design is similar to the nozzle design represented in FIG. 5A with a diameter of 500 μm for an exit orifice. The relaxation time r is upper bounded by 9.82 msec. The data associated with the constricted axisymmetric design of FIG. 5B is an identical simulation run on a constricted nozzle, with a constriction radius of 170 μm and a constriction length of 400 μm. The length of the shaping section is 100 μm the radius of the exit orifice equal to 250 μm. In this case, meniscus settling occurs significantly faster, with τ≤4.95 msec. The ratio of the relaxation times is very close to the ratio of the areas, as expected from the formulae described previously.

Behavior of the Nozzles at Different Pulsing Frequencies

Figure 11C:
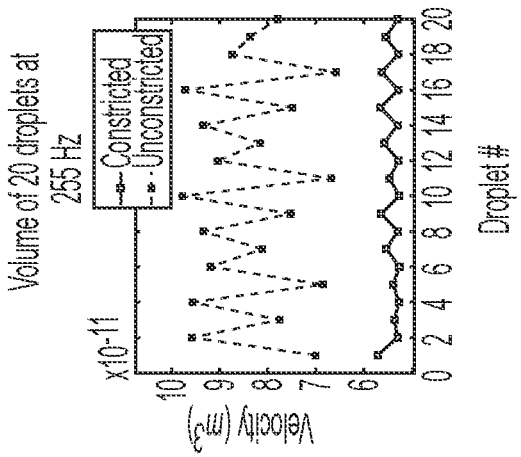
FIGS. 11A-11F are a series of plots illustrating multiple droplet simulations of constricted and unconstricted nozzles, for three jetting frequencies according to embodiments herein. Droplet volume and volume-averaged velocities are plotted versus droplet number.
Figure 11B:
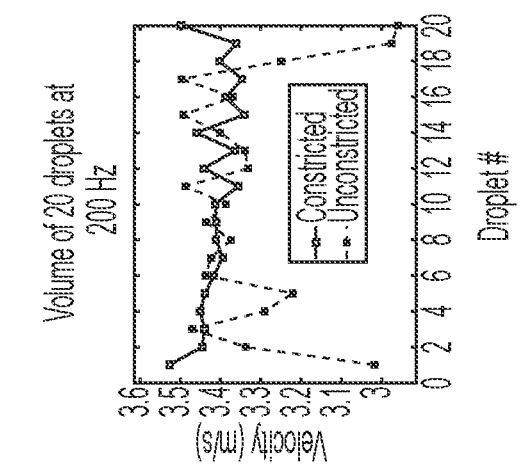
Figure 11A:
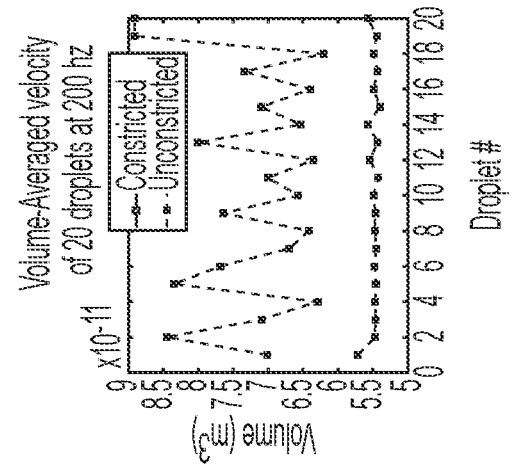
Figures 11D, 11E, 11F:
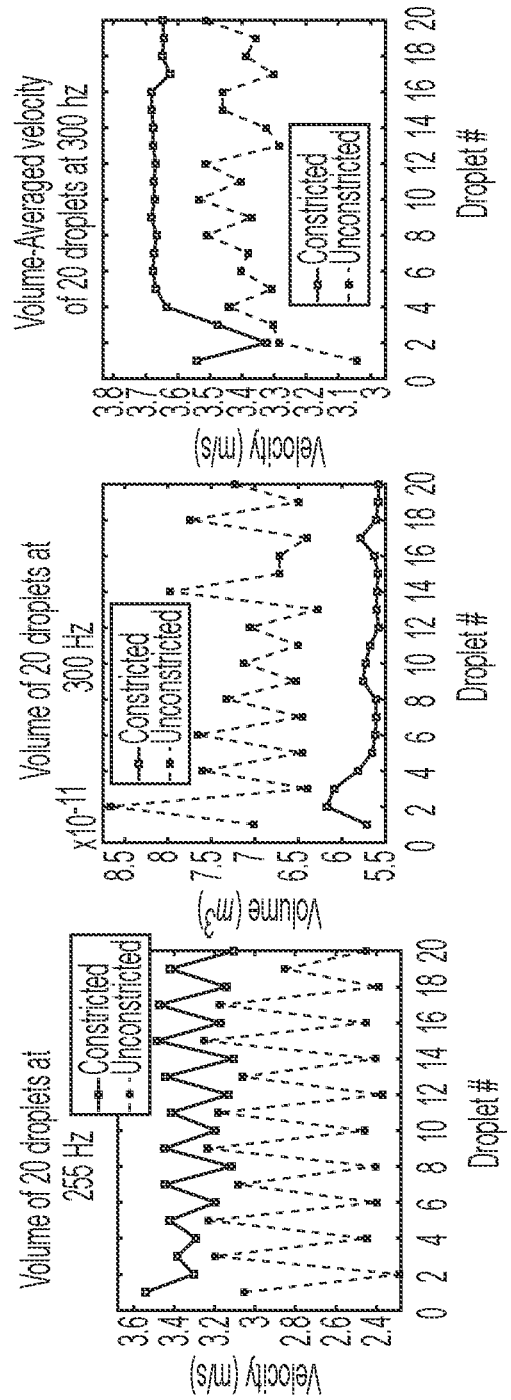

The behavior of the same constricted and unconstricted nozzles was then studied upon repeating a pressure pulse periodically in time with different frequencies resembling those used while printing in steady-state operation. Simulations were conducted in which 20 droplets are ejected with frequencies of 200 Hz, 255 Hz and 300 Hz. FIGS. 11A-11F are a series of plots illustrating multiple droplet simulations of constricted and unconstricted nozzles, for three jetting frequencies according to embodiments herein. Droplet volume and volume-averaged velocities are plotted versus droplet number. In FIGS. 11A, 11C, and 11E, drop volume for 20 droplets is plotted for 200 Hz, 255 Hz, and 300 Hz, respectively. In FIGS. 11B, 11D, and 11F, volume-averaged velocity of 20 droplets is plotted for 200 Hz, 255 Hz, and 300 Hz, respectively. The standard deviation of the volume and volume-averaged velocities over the 20 droplets plotted in FIGS. 11A-11F are presented in Table 2. It was also noted that for the unconstricted nozzle design 85%, 45% and 80% of ejected droplets broke apart before reaching the substrate, at firing frequencies 200 Hz, 255 Hz and 300 Hz, respectively. The corresponding rates in the constricted nozzle design are 0%, 0% and 10%, at firing frequencies 200 Hz, 255 Hz and 300 Hz, respectively. In all tested jetting frequencies, the results of the constricted nozzles display a very regular behavior from droplet to droplet, in contrast to the wilder variations of the unconstricted nozzle design.

TABLE 2

Standard Deviation of Droplet Specs

|  | 200 Hz | 255 Hz | 300 Hz |
|---|---|---|---|
| Constricted | | | |
| Velocity (m/s) | 0.049 | 0.152 | 0.089 |
| Volume ($10^{-12} m^3$) | 0.704 | 1.58 | 1.65 |
| Unconstricted | | | |
| Velocity (m/s) | 0.169 | 0.384 | 0.114 |
| Volume ($10^{-12} m^3$) | 8.82 | 10.8 | 6.48 |

Figure 12:
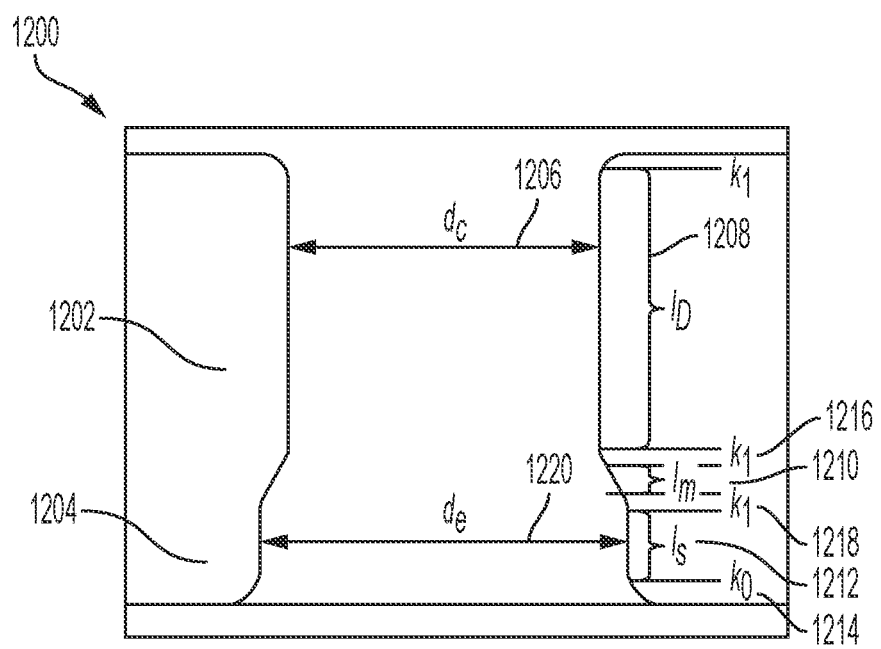
FIG. 12 illustrates a schematic cross-sectional view of a portion of a nozzle design, according to one or more embodiments disclosed, illustrating parameterization of the constricted axisymmetric nozzle design.

Next, a simulation-based study was conducted in which parameters of the nozzle geometry and of the input signal were varied. For this study, the axisymmetric design was chosen, as this is the most computationally efficient option. FIG. 12 illustrates a schematic cross-sectional view of a portion of a nozzle design, according to one or more embodiments disclosed, illustrating parameterization of the constricted axisymmetric nozzle design. A nozzle 1200 design used in subsequent simulations has adjustable design parameters representing dimensions of both a dissipative section 1202 and a shaping section 1204, which are a diameter of constriction $d_c$ 1206 of the dissipative section 1202 and a diameter of an exit orifice $d_e$ 1220 of the shaping section 1204. Fixed parameters for the nozzle simulation design illustrated in FIG. 12 include a length $l_D$ 1208 of the dissipative section 1202, a transition length $l_m$ 1210 between the dissipative section 1202 and the shaping section 1204, a length $l_S$ 1212 of the shaping section 1204. Other fixed parameters include an exit orifice length $\kappa_0$ 1214, an upper $\kappa_1$ 1216 and a lower $\kappa_1$ 1218, which represent transition lengths of merging parts that connect the various sections of nozzle for modeling purposes, which may be referred to as a transition zone. These parameters were fixed at $l_D$=0.26 mm, $l_m$=0.05 mm, $\kappa_0$=0.05 mm, $\kappa_1$=0.03 mm, $d_e$=0.4 mm, and $l_s$=0.05 mm.

Parametric Study I: Constriction Diameter

As mentioned earlier, in certain embodiments, nozzle geometry primarily controls the shape of the droplet, the droplet trajectory after break-up, its volume and speed. Also, the geometry can be modified to control the dissipation of energy. One way to study the effect of constriction on droplet specifications and meniscus relaxation time is by introducing a nozzle parametrization, such as that illustrated in FIG. 12. Simulations were conducted for different values of constriction diameter (dc) to obtain results of droplet volume and velocity as a function of dc. The input signal was kept fixed for all values of dc. The unconstricted nozzle may be represented by setting dc=de=0.4 mm.

Figures 13A, 13B:
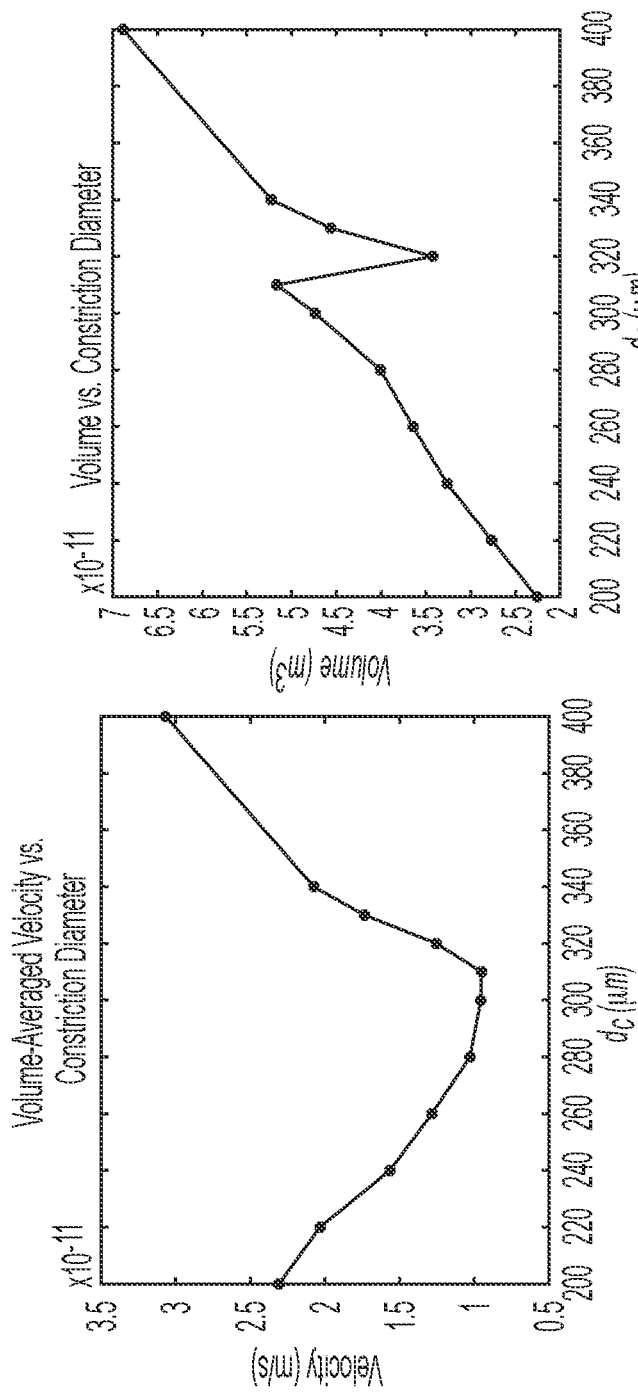
FIGS. 13A and 13B are plots of ejected droplet volume-averaged velocity as a function of constriction diameter, dc, and ejected droplet volume as a function of constriction diameter, dc, respectively.

Results from the parametric study in constriction diameter as shown and described in regard to FIG. 12 are presented in FIGS. 13A and 13B. FIGS. 13A and 13B are plots of ejected droplet volume-averaged velocity as a function of constriction diameter, dc, and ejected droplet volume as a function of constriction diameter, dc, respectively. As the constriction diameter decreases, the velocity and volume of the ejected mass initially decreases as well. Evidently, narrower sectional walls hinder liquid flow. Since the pressure pulse does not compensate with additional energy, the result is that less material is ejected and at slower speed. Finally, for constriction diameters dc=0.4, 0.3, 0.2 mm relaxation times were upper bounded by 0.0083 s, 0.0049 s and 0.0039 s, respectively. This is consistent with the expected relationship $\tau \propto d_c^2$. A significant change of monotonicity in the volume-averaged velocity is observed in FIG. 13B at around dc/de≈78%. The volume averaged velocity decreases steadily with dc until then, and suddenly it began to increase as dc is further decreased. At around the same value of dc a jump in the value of the ejected volume is observed. This behavior may be due to the fact that as the diameter of the constriction is decreased, the speed of the fluid inside it increases. When the fast moving fluid enters the shaping section, the viscosity of the fluid and the increase in pressure it generates is not enough to accelerate the fluid on the outer regions of the shaping section. Thus, the fluid coming from the dissipative section loses less momentum to the surrounding fluid, causing it to exit the nozzle at a faster speed. The ejected mass often involves fluid with significantly different speeds, which may result in the breakup of the droplet and sometimes in the ejection of satellites.

Parametric Study II: Input Sinal

Figure 14:
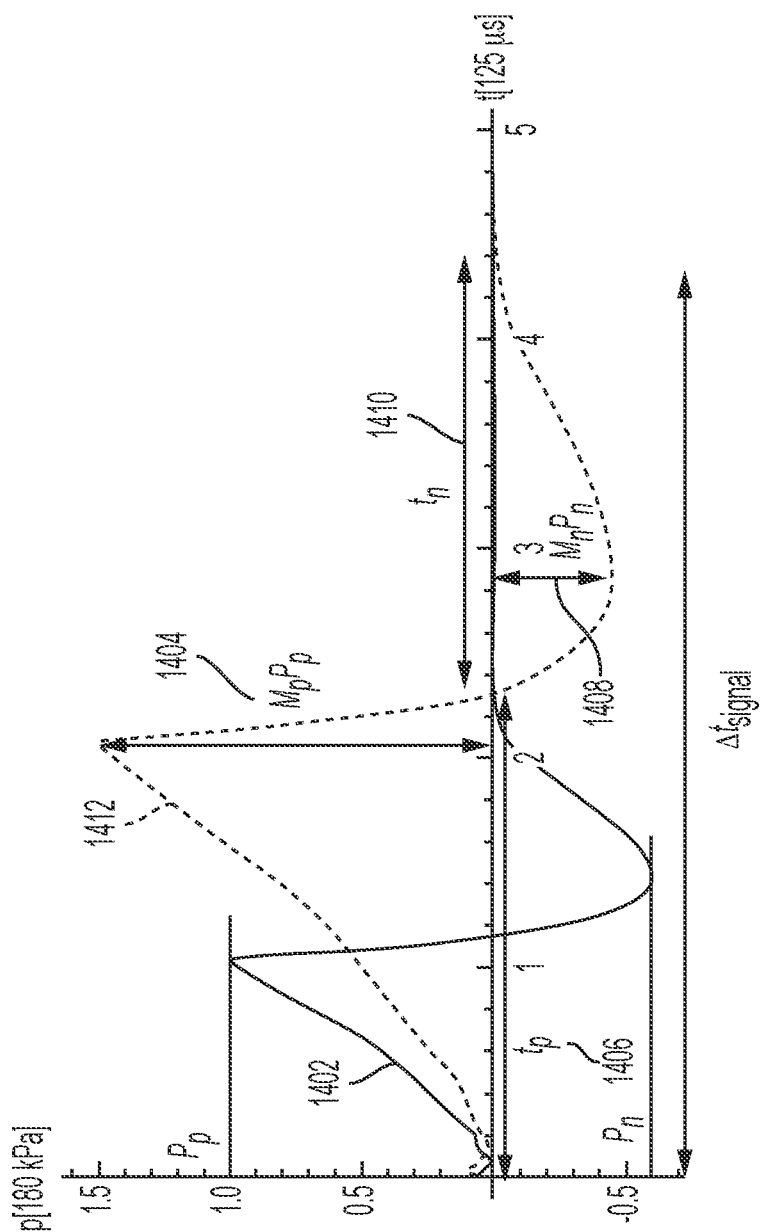
FIG. 14 is a spatio/temporal scaled plot of a characteristic waveform showing its positive and negative components, according to an embodiment.
Figure 15A:
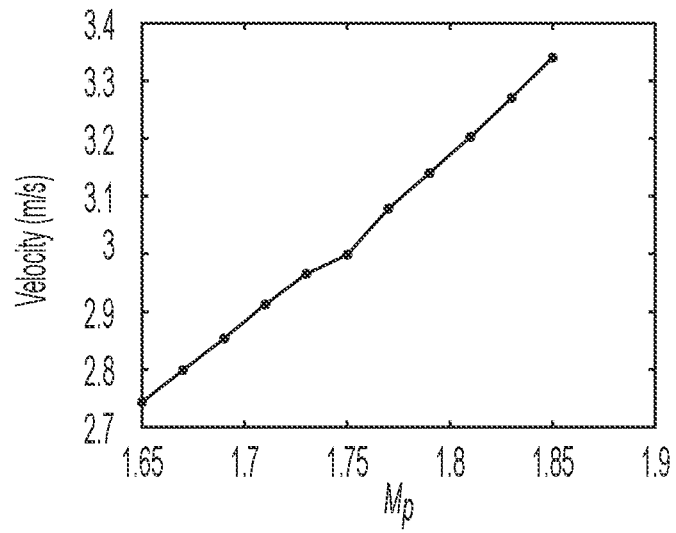
FIGS. 15A-15D are a series of four plots illustrating the results of parametric simulation of a positive part of the waveform of FIG. 14 and the waveform effect on droplet velocity and volume, according to an embodiment.
Figure 15B:
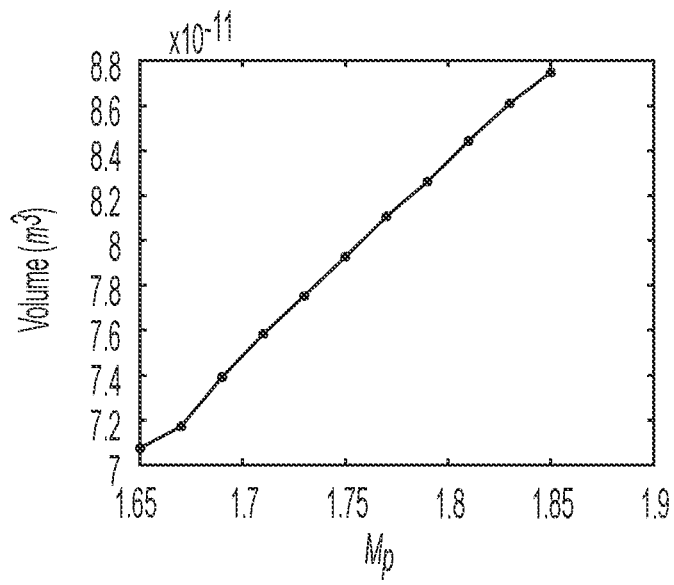
Figure 15C:
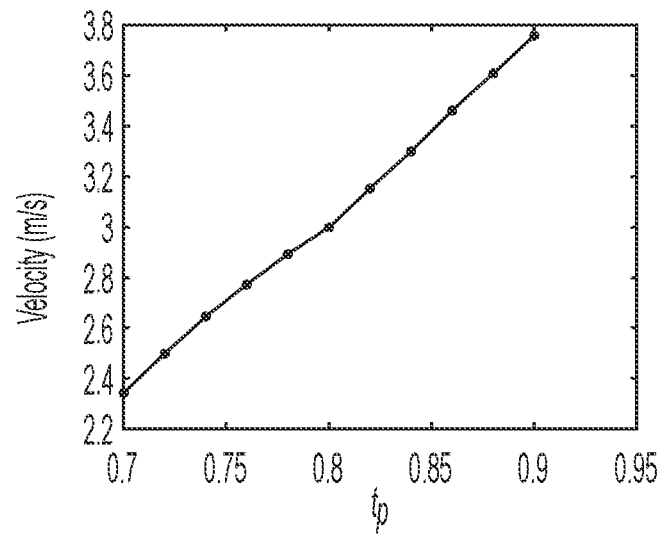
Figure 15D:
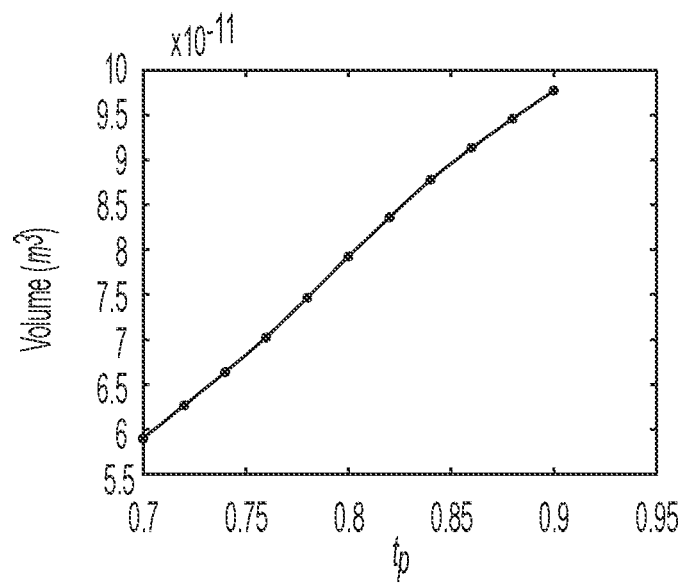

The input signal provides the energy that enters the nozzle/liquid system. It primarily controls the droplet velocity and volume and consequently it influences the break-up specifications of time and location. Secondly, the input signal affects the droplet shape and the dissipation of energy in a nozzle design simulation. In printing devices, waveforms such as the one illustrated in FIG. 10 are an output of hardware circuits that control the strength and the duration of the positive and negative parts of the signal. With a fixed the nozzle geometry, the shape of the pressure signal may be defined and adjusted to obtain droplets with the desired characteristics. One method of exploring the sensitivity of the droplet's characteristics to the pressure signal is to fix a realized waveform as a reference and introduce magnification parameters as surrogates to hardware-based controllers that affect its strength and duration. FIG. 14 is a spatio/temporal scaled plot of a characteristic waveform showing its positive and negative components, according to an embodiment. A systematic modification of a reference pulse 1402 is simulated for several parameters of the wavelength depicted in FIG. 14, by variation of parameters Mp (magnitude of the positive generation portion of the waveform) 1404, tp (duration of the positive generation portion of the waveform) 1406 that scale the positive part of the pulse, and analog parameters Mn (magnitude of the negative ejection portion of the waveform) 1408, tn (duration of the negative ejection portion of the waveform) 1410 for the negative part of the pulse. This change is represented by a wavelength 1412. For the nozzle geometry design defined by dc=0.35 mm, de=0.4 mm and lD=0.05 mm, the computed results for the droplet characteristics with varying Mp and tp are shown in FIGS. 15A-15D. FIGS. 15A-15D are a series of four plots illustrating the results of parametric simulation of a positive part of the waveform of FIG. 14 and the waveform effect on droplet velocity and volume, according to an embodiment. FIGS. 15A and 15B are plots of velocity versus Mp and volume versus Mp, respectively. FIGS. 15C and 15D are plots of velocity versus tp and volume versus tp, respectively. The effect of the pushing part of the pressure pulse is illustrated, while keeping the pulling/sucking part of the waveform constant and equal to the reference signal. A strong linear behavior of droplet characteristics can be observed with respect to the pushing parameters. The smooth variation of both quantities illustrates the possibility of tailoring the signal to adjust the volume and speed of the droplet within some range. However, this smooth variation of the volume and the speed with pulse parameters does not reflect the effect they have on the droplet shape, which can be significantly altered. Pressure pulses with Mp large enough, and certainly within the range in FIGS. 15A and 15B, accelerate the fluid enough to generate droplets that are too elongated and/or that break up after ejection. Therefore, it is unlikely to form one single droplet of acceptable shape in such range. In contrast to modifying the Mp and tp values, the values of Mn and tn affect the droplet characteristics in complex way. Results of other parametric studies outside the scope of these studies suggest that large values of Mn, tn have negative effects in the dynamics. These negative effects range from slowing down the flow in the nozzle and in the ejected droplet, to inducing a large kinetic energy load, partially due to stronger sucking, that takes an undesirably long time to be dissipated.

Figure 17:
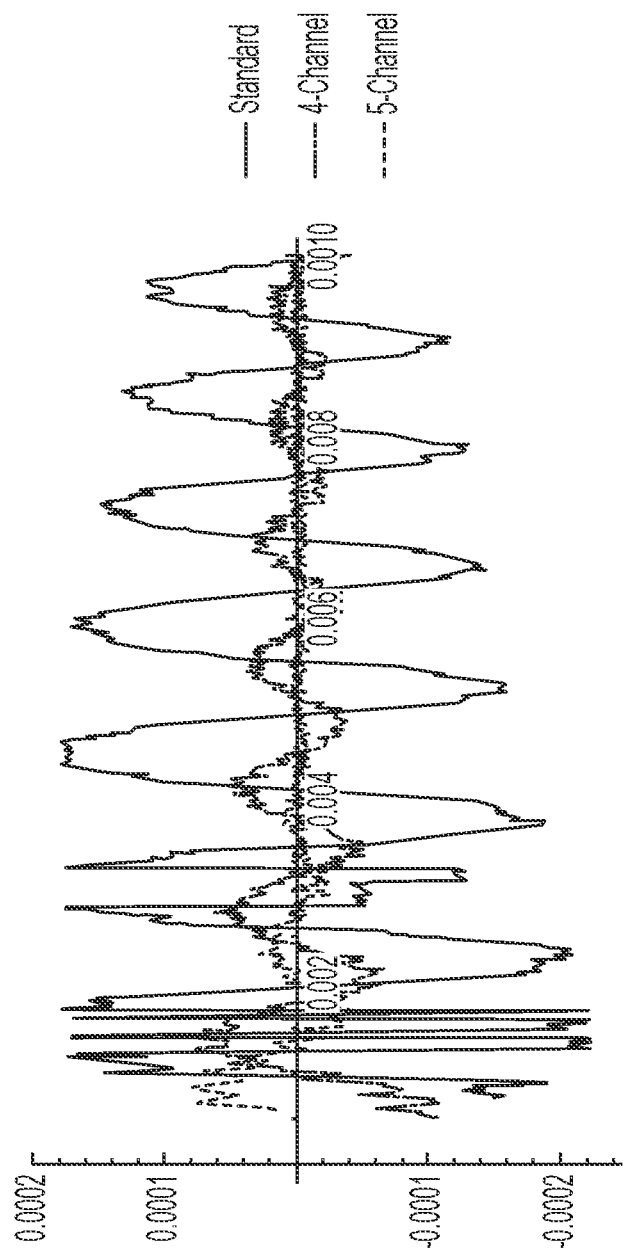
FIG. 17 is a plot illustrating a simulated meniscus displacement as a function of time for the ejection of a droplet from the multichannel nozzle embodiments of FIGS. 16A and 16B as compared to a standard unconstricted nozzle design embodiment.

Additional simulations were conducted using the showerhead multichannel nozzle design of FIG. 4B, wherein the dissipation section consists of at least two multiple narrow channels. As discussed previously in regard to FIG. 4B, the relaxation time of this channel scales with the sum of the areas of the cross sections of each narrow channel. An additional advantage of this multichannel nozzle design is that by pushing the meniscus in a more distributed manner over the exit orifice, it increases the range of speeds at which the fluid can be pulsed or jetted through the dissipative section without generating multiple droplets upon ejection. FIGS. 16A and 16B illustrate top views of a dissipative section in a multichannel nozzle having four channels and five channels, respectively. Additional studies of droplet ejection were studied using the designs illustrated in FIGS. 16A and 16B. The multichannel nozzle design 1602 of FIG. 16A contains four symmetrically placed channels 1602A, 1602B, 1602C, 1602D of 160 μm diameter each, and the multichannel nozzle design 1604 of FIG. 16B contains five symmetrically placed channels 1604A, 1604B, 1604C, 1604D, 1604E of 120 μm diameter each. FIG. 17 is a plot illustrating a simulated meniscus displacement as a function of time for the ejection of a droplet from the multichannel nozzle embodiments of FIGS. 16A and 16B as compared to a standard unconstricted nozzle design embodiment. FIG. 17 illustrates the meniscus motion in a single droplet event for the four-channel multichannel nozzle design of FIG. 16A and the five-channel multichannel nozzle design of FIG. 16B as compared to a standard nozzle design. The meniscus motion results over time suggest that both the four channel and five channel nozzle designs having multichannel dissipative sections both dissipate energy considerably faster than the standard design, with upper estimates 0.0098 s for the standard design, 0.005 s for the 4-channel and 0.003 s for the five-channel nozzle.

Certain embodiments of design methods for designing nozzles for use in printing systems as described herein include several steps for selecting system boundaries or design constraints, and model input parameters. Once design constraints for a printing system are established, such as relaxation time boundaries, droplet specifications, for example, drop volume, drop speed, and drop shape, other concerns may be addressed such as orifice length, hardware, material, and manufacturability of proposed printing system elements. Selecting additional system inputs such as pulsed waveforms, tank geometry, type of fluid dissipation, and printing material physical properties at jetting conditions may be addressed at this time in certain embodiments.

Designing a constricted dissipative section begins, in certain embodiments, with choosing or selecting a radius of an axisymmetric constriction, cumulative cross-sectional area of channels in a shower-head or multichannel dissipative section, or within a cross-channel type dissipative section, or permeability of foam material or other porous media within a permeable dissipative nozzle section. The length of the dissipative section and shaping section of the nozzle is then selected using calculation and modeling methods as described previously. The overall orifice length may be considered in the dissipative section or shaping section length selection. The other dissipative section geometrical features, shapes, and other features may then be parameterized in modeling, calculations, and other input parameters to arrive at a desired dissipative section design. Designing a shaping section for nozzles of embodiments described herein may include sizing and configuring a shaping section to accommodate a minimum drop volume and maximizing a merging transition zone or inter-area between the dissipative section and the shaping section while taking drop speed and shape into consideration. If the appropriate system conditions are met by parameterization of the described design method, a pulse may be applied either in simulation or with a manufactured nozzle for testing and verification purposes. If these conditions satisfying the design constraints and system input parameters are not met, a subset of parameterization and design selection may be appropriate.

In certain design embodiments, if no droplet is ejected, the pulse strength may be increased within proposed hardware, manufacturability, or strength of materials considerations. If not successful, the input parameter specifications may be reviewed and parameters related to the length, relaxation time boundaries, and manufacturability may be redesigned. Printing material fluid properties may need to be redesigned as well. In other embodiments, if no droplet is ejected due to expected drop volume not being realized, the waveform pulse may be modified (increased or decreased) within hardware or manufacturability limitations. In this instance, design considerations related to the shaping section may be reiterated if expected drop volume is still not achieved. In other embodiments, if no droplet is ejected due to expected drop speed not being realized, the waveform pulse may be modified (increased or decreased) within hardware or manufacturability limitations. In this instance, design considerations related to the parameters associated with the dissipative section may be reiterated if expected drop volume is still not achieved. In other embodiments, if no droplet is ejected due to expected drop shape not being realized, design considerations related to the parameters associated with the dissipative section may be reiterated or design considerations related to the parameters associated with the transition zone between the dissipative section and the shaping section may be reiterated. In this instance, further reiteration of design parameters related to the parameters associated with the transition zone between the dissipative section and the shaping section may be conducted if expected drop shape is still not achieved. Parametric studies using computer modeling or computer simulation as described herein may be used in designing nozzle geometry of various dimensions of the dissipative section, the shaping section, the transition zone between the dissipative section and shaping section, the tank, or other elements in certain embodiments.

Figure 18:
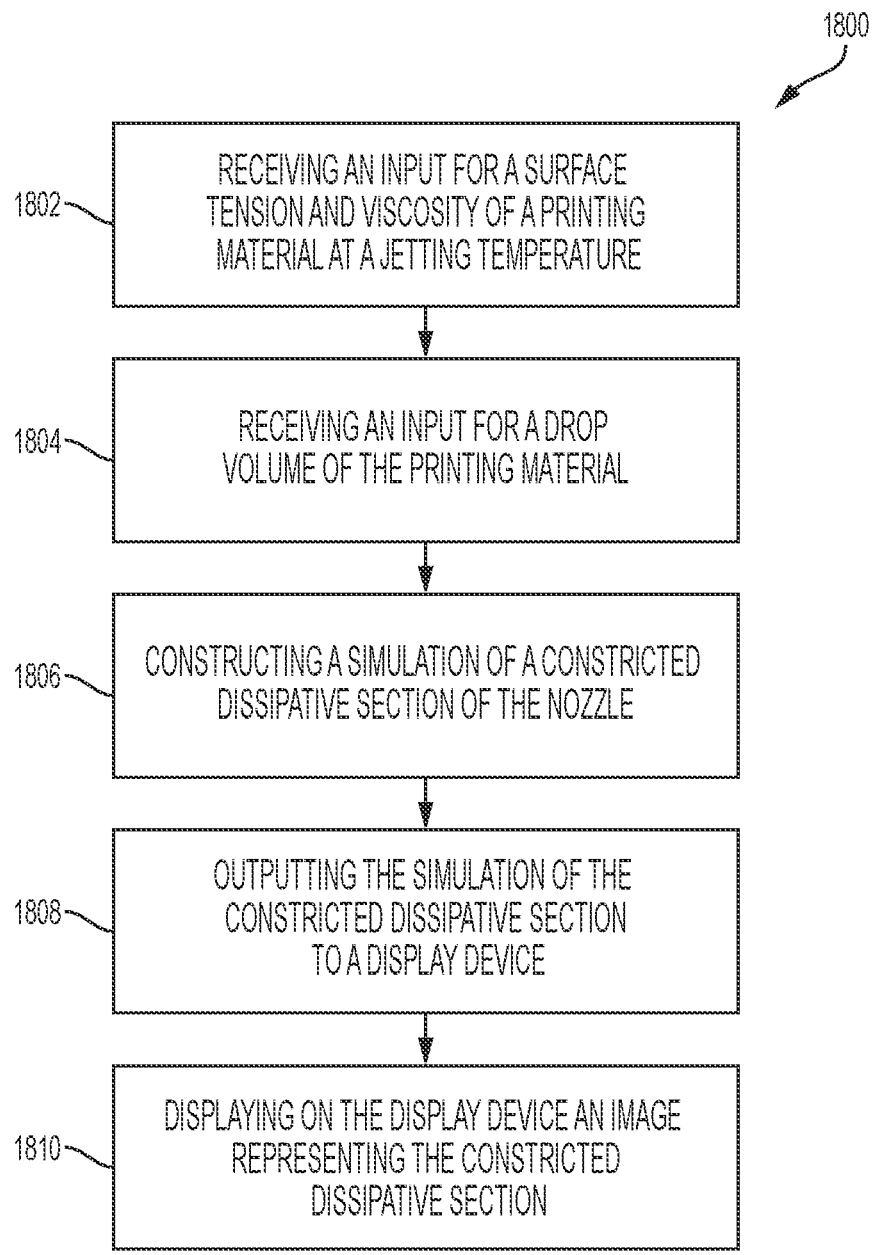
FIG. 18 is a functional block diagram of a method for designing a nozzle for jetting printing material in a printing system, according to an embodiment.

FIG. 18 is a functional block diagram of a method for designing a nozzle for jetting printing material in a printing system, according to an embodiment. FIG. 18 depicts a method 1800 including a computer readable medium comprising instructions which, when executed by at least one electronic processor, configure the at least one electronic processor to execute a method for designing a nozzle for jetting printing material in a printing system. Certain embodiments can further include a software or hardware application to allow a user to control the electronic processor. The software application can be, for example, a non-transitory computer readable medium storing instructions, that when executed by a hardware processor, performs a method of providing a graphical user interface on the display to allow a user to control various simulations, for example, including parameterized geometrical and dimensional attributes of a nozzle for ejecting printing material. Optionally, the software application can automatically substitute and varying numerical representations of dimensional parameters of a type of nozzle design. The method 1800 further includes receiving an input for a surface tension and viscosity of a printing material at a jetting temperature 1802 and receiving an input for a drop volume of the printing material 1804 as inputs by a user or by a request generated by a user. Instructions can then be provided to operate one or more simulations to be run by the electronic processor, and a simulation constructing a constricted dissipative section of the nozzle may be performed 1806. The software application or the computer readable medium or electronic processor can then provide instructions to implement the simulation of constructing the constricted dissipative section of the nozzle to be performed by solving for and/or defining a length of the constricted dissipative section with respect to an orifice length and solving for and/or defining a cross-sectional area of the constricted dissipative section. Next, an output of the simulation or construction of the constricted dissipative section is transmitted to a display device 1808, and an image representing the constricted dissipative section is displayed on the display device 1810.

In various embodiments, a hardware configuration may include the computer readable medium which can be used to perform one or more of the processes described above. The hardware configuration may include any type of mobile devices, such as smart telephones, laptop computers, tablet computers, cellular telephones, personal digital assistants, etc. Further the hardware configuration can include one or more processors of varying core configurations and clock frequencies. The hardware configuration may also include one or more memory devices that serve as a main memory during operations, calculations, or simulations as described herein. For example, during operation, a copy of the software that supports the above-described operations can be stored in one or more memory devices. One or more peripheral interfaces, such as keyboards, mice, touchpads, computer screens, touchscreens, etc., for enabling human interaction with and manipulation of the hardware configuration may also be included. Exemplary hardware configurations can also include a data bus, one or more storage devices of varying physical dimensions and storage capacities, such as flash drives, hard drives, random access memory, etc., for storing data, such as images, files, and program instructions for execution by the one or more processors. One or more network interfaces for communicating via one or more networks, such as Ethernet adapters, wireless transceivers, or serial network components, for communicating over wired or wireless media using protocols may further be included.

Additionally, hardware configurations in certain embodiments can include one or more software programs that enable the functionality described herein. The one or more software programs can include instructions that cause the one or more processors to perform the processes, functions, and operations described herein related to calculations, inputs, simulations, pulsed waveform generation, and combinations thereof. Copies of the one or more software programs can be stored in the one or more memory devices and/or on in the one or more storage devices. Likewise, the data utilized by one or more software programs can be stored in the one or more memory devices and/or on in the one or more storage devices.

If implemented in software, the functions can be stored on or transmitted over a computer-readable medium as one or more instructions or code. Computer-readable media includes both tangible, non-transitory computer storage media and communication media including any medium that facilitates transfer of a computer program from one place to another. A storage media can be any available tangible, non-transitory media that can be accessed by a computer. By way of example, and not limitation, such tangible, non-transitory computer-readable media can comprise RAM, ROM, flash memory, or EEPROM. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above should also be included within the scope of computer-readable media.

In one or more exemplary embodiments, the functions described can be implemented in hardware, software, firmware, or any combination thereof. For a software implementation, the techniques described herein can be implemented with modules (e.g., procedures, functions, subprograms, programs, routines, subroutines, modules, software packages, classes, and so on) that perform the functions described herein. A module can be coupled to another module or a hardware circuit by passing and/or receiving information, data, arguments, parameters, or memory contents. Information, arguments, parameters, data, or the like can be passed, forwarded, or transmitted using any suitable means including memory sharing, message passing, token passing, network transmission, and the like. The software codes can be stored in memory units and executed by processors. The memory unit can be implemented within the processor or external to the processor, in which case it can be communicatively coupled to the processor via various means as is known in the art.

In one or more exemplary embodiments, the functions described can be implemented in hardware, software, firmware, or any combination thereof. For a software implementation, the techniques described herein can be implemented with modules (e.g., procedures, functions, subprograms, programs, routines, subroutines, modules, software packages, classes, and so on) that perform the functions described herein. A module can be coupled to another module or a hardware circuit by passing and/or receiving information, data, arguments, parameters, or memory contents. Information, arguments, parameters, data, or the like can be passed, forwarded, or transmitted using any suitable means including memory sharing, message passing, token passing, network transmission, and the like. The software codes can be stored in memory units and executed by processors. The memory unit can be implemented within the processor or external to the processor, in which case it can be communicatively coupled to the processor via various means as is known in the art.

In other embodiments, a non-transitory computer-readable medium may include instructions, that when executed by a hardware processor, causes the hardware processor to perform operations to execute a method for designing a nozzle for jetting printing material in a printing system. This method may include receiving an input for a surface tension and viscosity of a printing material at a jetting temperature, receiving an input for a drop volume of the printing material, and constructing a simulation of a constricted dissipative section of the nozzle. This construction or designing of the dissipative section may further include defining a length of the constricted axisymmetric dissipative section with respect to an orifice length and defining a cross-sectional area of the constricted axisymmetric dissipative section.

The present disclosure has been described with reference to exemplary implementations. Although a limited number of implementations have been shown and described, it will be appreciated by those skilled in the art that changes may be made in these implementations without departing from the principles and spirit of the preceding detailed description. It is intended that the present disclosure be construed as including all such modifications and alterations insofar as they come within the scope of the appended claims or the equivalents thereof.

What is claimed is:

1. A method for designing a nozzle for jetting printing material in a printing system, the method comprising:
    selecting a surface tension and viscosity of a printing material at a jetting temperature;
    selecting a drop volume of the printing material; and
    constructing a constricted axisymmetric dissipative section of the nozzle, comprising:
        defining a length of the constricted axisymmetric dissipative section with respect to an orifice length;
        defining a cross-sectional area of the constricted axisymmetric dissipative section;
        defining a diameter of constriction, $d_c$, of the constricted axisymmetric dissipative section that is approximately constant along the length of the constricted axisymmetric dissipative section; and
    expelling a build material from the nozzle, the nozzle comprising the defined length and cross-sectional area of the constricted axisymmetric dissipative section; and wherein
        a relaxation time, $\tau$, of the nozzle is independent of the defined length of the constricted axisymmetric dissipative section and is proportional to $d_c^2$.

2. The method of claim 1, further comprising selecting an exit orifice size and a shape of a shaping section of the nozzle.

3. The method of claim 1, further comprising selecting a length of a transition zone between the constricted axisymmetric dissipative section and a shaping section.

4. The method of claim 1, further comprising:
    selecting a pressure pulse waveform; and
    applying the pressure pulse waveform to an upper boundary of the nozzle.

5. The method of claim 4, wherein the pressure pulse waveform further comprises:
    a magnitude of a positive generation portion of the pressure pulse waveform, Mp; and
    a duration of a positive generation portion of the pressure pulse waveform, tp.

6. The method of claim 1, further comprising selecting a drop speed for jetting a printing material.

7. The method of claim 1, wherein the cross-sectional area of the constricted axisymmetric dissipative section is further defined as a function of a specified relaxation time of a printing material.

8. The method of claim 1, further comprising ejecting a droplet from the nozzle.

9. A method for designing a nozzle for jetting printing material in a printing system, the method comprising:
    selecting a surface tension and viscosity of a printing material at a jetting temperature;
    selecting a drop volume of the printing material; and
    constructing a constricted dissipative section of the nozzle having at least three channels, comprising:
        defining a length of the constricted dissipative section with respect to an orifice length;
        defining a cumulative cross-sectional area of the at least three channels of the constricted dissipative section of the nozzle;
        defining a diameter of constriction, $d_c$, of the constricted dissipative section that is approximately constant along the length of the constricted dissipative section; and
    expelling a build material from the nozzle, the nozzle comprising the defined length and cumulative cross-sectional area of the constricted dissipative section; and wherein
        a relaxation time, $\tau$, of the nozzle is independent of the defined length of the constricted dissipative section and is proportional to $d_c^2$.

10. The method of claim 9, further comprising selecting an exit orifice size and shape of a shaping section of the nozzle.

11. The method of claim 9, further comprising selecting a length of a transition zone between the constricted dissipative section and a shaping section.

12. The method of claim 9, further comprising:
    selecting a pressure pulse waveform; and
    applying the pressure pulse waveform to an upper boundary of the nozzle.

13. The method of claim 12, wherein the pressure pulse waveform further comprises:
    a magnitude of a positive generation portion of the pressure pulse waveform, Mp; and
    a duration of a positive generation portion of the pressure pulse waveform, tp.

14. The method of claim 9, further comprising selecting a drop speed for jetting a printing material.

15. The method of claim 9, further comprising selecting a cross-sectional area of a constricted dissipative section of the nozzle as a function of a specified relaxation time of a printing material.

16. The method of claim 9, further comprising ejecting a droplet from the nozzle.

17. A method for designing a nozzle for jetting printing material in a printing system, the method comprising:
    selecting a surface tension and viscosity of a printing material at a jetting temperature;
    selecting a drop volume of the printing material; and
    constructing a constricted dissipative section of the nozzle, comprising:
        defining a length of the constricted dissipative section with respect to an orifice length;
        defining a permeability of the constricted dissipative section of the nozzle further comprising a porous media;
        defining a diameter of constriction, $d_c$, of the constricted dissipative section that is approximately constant along the length of the constricted dissipative section; and
    expelling a build material from the nozzle, the nozzle comprising the defined length and permeability of the constricted dissipative section; and wherein a relaxation time, τ, of the nozzle is independent of the defined length of the constricted dissipative section and is proportional to $d_c^2$.

18. The method of claim 17, further comprising selecting an exit orifice size and a shape of a shaping section of the nozzle.

19. The method of claim 17, further comprising:
selecting a pressure pulse waveform; and
applying the pressure pulse waveform to an upper boundary of the nozzle.

20. The method of claim 19, wherein the pressure pulse waveform further comprises:
a magnitude of a positive generation portion of the pressure pulse waveform, Mp; and
a duration of a positive generation portion of the pressure pulse waveform, tp.

21. The method of claim 17, further comprising selecting a drop speed for jetting a printing material.

22. The method of claim 17, further comprising selecting a cross-sectional area of the constricted dissipative section of the nozzle as a function of a specified relaxation time of a printing material.

23. The method of claim 17, further comprising ejecting a droplet from the nozzle.

24. A method for designing a nozzle for jetting printing material in a printing system, the method comprising:
selecting a surface tension and viscosity of a printing material at a jetting temperature;
selecting a drop volume of the printing material; and
constructing a constricted dissipative section of the nozzle, comprising:
defining a length of the constricted dissipative section with respect to an orifice length;
defining a cross-sectional area of the constricted dissipative section of the nozzle having at least two intersecting channels wherein the at least two intersecting channels comprise at least two walls that are parallel to one another;
defining a diameter of constriction, $d_c$, of each constricted dissipative section that is approximately constant along the length of the constricted dissipative section; and
expelling a build material from the nozzle, the nozzle comprising the defined length and cross-sectional area of the constricted dissipative section; and wherein
a relaxation time, τ, of the nozzle is independent of the defined length of the constricted dissipative section and is proportional to $d_c^2$.

25. The method of claim 24, further comprising selecting an exit orifice size and shape of a shaping section of the nozzle.

26. The method of claim 24, wherein the cross-sectional area of the constricted dissipative section is further defined as a function of a specified relaxation time of a printing material.

27. The method of claim 24, further comprising ejecting a droplet from the nozzle.

28. A non-transitory computer readable medium comprising instructions which, when executed by at least one electronic processor, configure the at least one electronic processor to execute a method for designing a nozzle for jetting printing material in a printing system, the method comprising:
receiving an input for a surface tension and viscosity of a printing material at a jetting temperature;
receiving an input for a drop volume of the printing material;
constructing a simulation of a constricted dissipative section of the nozzle by:
defining a length of the constricted dissipative section with respect to an orifice length; and
defining a cross-sectional area of the constricted dissipative section;
outputting the simulation of the constricted dissipative section to a display device;
defining a diameter of constriction, $d_c$, of the constricted dissipative section that is approximately constant along the length of the constricted dissipative section;
displaying on the display device an image representing the constricted dissipative section; and
expelling a build material from the nozzle, the nozzle comprising the defined length and cross-sectional area of the constricted dissipative section; and wherein
a relaxation time, τ, of the nozzle is independent of the defined length of the constricted dissipative section and is proportional to $d_c^2$.

29. The method of claim 28, further comprising:
receiving an input for a pressure pulse waveform; and
applying the pressure pulse waveform to an upper boundary of the nozzle.

30. The method of claim 29, wherein receiving an input for the pressure pulse waveform further comprises:
receiving an input for a magnitude of a positive generation portion, Mp, of the pressure pulse waveform; and
receiving an input for a duration of a positive generation portion, tp, of the pressure pulse waveform.

* * * * *